(12) United States Patent
Kawano

(10) Patent No.: US 11,798,920 B2
(45) Date of Patent: Oct. 24, 2023

(54) LIGHT EMITTING DEVICE AND METHOD OF MANUFACTURING THE LIGHT EMITTING DEVICE

(71) Applicant: NICHIA CORPORATION, Anan (JP)

(72) Inventor: Yusuke Kawano, Anan (JP)

(73) Assignee: NICHIA CORPORATION, Anan (JP)

( * ) Notice: Subject to any disclaimer, the term of this patent is extended or adjusted under 35 U.S.C. 154(b) by 147 days.

(21) Appl. No.: 17/320,750

(22) Filed: May 14, 2021

(65) Prior Publication Data

US 2021/0272939 A1 Sep. 2, 2021

Related U.S. Application Data

(62) Division of application No. 16/448,800, filed on Jun. 21, 2019, now Pat. No. 11,043,475.

(30) Foreign Application Priority Data

Jun. 22, 2018 (JP) .................................. 2018-118579

(51) Int. Cl.
*H01L 25/07* (2006.01)
*H01L 25/075* (2006.01)

(52) U.S. Cl.
CPC ................................ *H01L 25/0753* (2013.01)

(58) Field of Classification Search
None
See application file for complete search history.

(56) References Cited

U.S. PATENT DOCUMENTS

| | | |
|---|---|---|
| 2011/0116252 A1 | 5/2011 | Agatani et al. |
| 2011/0299268 A1 | 12/2011 | Ishizaki et al. |
| 2014/0084311 A1 | 3/2014 | Takeda et al. |
| 2014/0197431 A1* | 7/2014 | Oka .................. H01L 33/50 257/88 |
| 2016/0149094 A1* | 5/2016 | Onuma ................ H01L 33/504 257/89 |
| 2016/0172564 A1 | 6/2016 | Yamaguchi et al. |
| 2016/0343693 A1* | 11/2016 | Kuriki ................ H01L 25/0753 |
| 2018/0069162 A1 | 3/2018 | Abe et al. |

FOREIGN PATENT DOCUMENTS

| | | |
|---|---|---|
| JP | 2011-108744 A | 6/2011 |
| JP | 2011-258611 A | 12/2011 |
| JP | 2013-153081 A | 8/2013 |

(Continued)

*Primary Examiner* — Moin M Rahman
(74) *Attorney, Agent, or Firm* — Birch, Stewart, Kolasch & Birch, LLP

(57) ABSTRACT

A light emitting device includes a substrate, a plurality of light emitting elements disposed in a light-emitting region on the substrate, at least one first wiring part surrounding the light-emitting region, at least one second wiring part, together with the at least one first wiring part, demarcating the light-emitting region into a plurality of demarcated regions, a first wall formed along and covering the at least one first wiring part to surround the light-emitting region, at least one second wall formed along and covering corresponding one or more of the at least one second wiring part, and a light-transmissive member containing a wavelength converting material, covering an entire light-emitting region.

10 Claims, 13 Drawing Sheets

(56) References Cited

FOREIGN PATENT DOCUMENTS

| | | |
|---|---|---|
| JP | 2014-36063 A | 2/2014 |
| JP | 2014-67816 A | 4/2014 |
| JP | 2014-179653 A | 9/2014 |
| JP | 2016-119381 A | 6/2016 |
| JP | 2016-178343 A | 10/2016 |
| JP | 2017-103416 A | 6/2017 |
| JP | 2017-204502 A | 11/2017 |
| JP | 2018-41843 A | 3/2018 |
| JP | 2018-46113 A | 3/2018 |
| JP | 2018-93151 A | 6/2018 |

* cited by examiner

LIGHT EMITTING DEVICE AND METHOD OF MANUFACTURING THE LIGHT EMITTING DEVICE

CROSS-REFERENCE TO RELATED PATENT APPLICATION

This application is a Division of copending U.S. patent application Ser. No. 16/448,800, filed Jun. 21, 2019, which claims priority under 35 U. S. C. § 119(a) to Japanese Patent Application No. 2018-118579, filed Jun. 22, 2018, all of which are hereby expressly incorporated by reference into the present application in their entirety.

BACKGROUND

Technical Field

The present disclosure relates to a light emitting device and a method of manufacturing the light emitting device.

Description of Related Art

There has been proposed a light emitting device having a circular resin frame provided on a board, a plurality of light emitting elements arranged on the board surrounded by the resin frame, and a light-transmissive resin containing a phosphor is disposed to cover within the resin frame, as in Japanese Unexamined Patent Application Publication No. 2018-041843. In the light emitting device, relay wirings are disposed parallel to each other at its center, such that the light emitting elements can be connected in series even when the number of the light emitting elements is increased.

SUMMARY

The light emitting device described in Japanese Unexamined Patent Application Publication No. 2018-041843 allows connection in series of an increased number of light emitting elements disposed on the substrate, but the relay lines are arranged in two rows at a center, which creates a wide opening between the light emitting elements in the lighting region. As a result, a portion which does not emit light is created at a center of the light-emitting region of the light emitting device, such that a uniform distribution of light becomes difficult to obtain.

Therefore, the Accordingly, an object of the certain embodiments is to provide a light emitting device having a plurality of light Distribution disposed on a substrate, in which color unevenness and/or luminance unevenness in the emitting light has been reduced, and to provide a method of manufacturing the light emitting device.

A light emitting device according to certain embodiments of the present disclosure includes: a substrate; a plurality of light emitting elements disposed on the substrate; at least one first wiring part surrounding a light-emitting region on the substrate where the plurality of light emitting elements are disposed, at least one second wiring part, together with the at least one first wiring part, demarcating the light-emitting region into a plurality of demarcated regions; a first wall formed along and covering the first wiring part, to surround the light-emitting region; at least one second wall formed along and covering corresponding one or more of the at least one second wiring part; and a light-transmissive member containing a wavelength converting material, covering an entire light-emitting region including the plurality of light emitting elements disposed in each of the plurality of demarcated regions. The at least one first wiring part and the at least one second wiring part demarcating each of the plurality of demarcated regions are formed such that at least a portion of the at least one first wiring part is an anode-side wiring and at least a portion of the at least one second wiring part is a cathode-side wiring, or at least a portion of the at least one first wiring part is a cathode-side wiring and at least a portion of the at least one second wiring part is an anode-side wiring. The plurality of light emitting elements are divided and disposed in the plurality of demarcated regions. The light emitting elements disposed in each of the demarcated regions are connected by wires in series to form at least one string of the light emitting elements, and the at least one string of the light emitting elements is connected in parallel to the anode-side wire and the cathode-side wire.

A method of manufacturing a light emitting device according to certain embodiments of the present disclosure includes: disposing a wiring pattern including at least one first wiring part and at least one second wiring part, the at least one first wiring part surrounding a light-emitting region on a substrate, and the at least one second wiring part being continuous to the at least one first wiring parts, demarcating the light-emitting region surrounded by the at least one first wiring part into a plurality of demarcated regions; disposing a plurality of light emitting elements in each of the demarcated regions; wire connecting the plurality of light emitting elements to form a plurality of serial connections of light emitting elements in each of the demarcated regions, each serial connection connected to a corresponding one of the at least one first wiring part and a corresponding one of the at least one second wiring part; forming line-shaped walls comprising forming at least one second wall in a line shape along and covering corresponding one or more of the at least one second wiring part, and forming a first wall in a line shape along and covering the at least one first wiring part; and sealing an entire of the light-emitting region surrounded by the at least one first wiring parts, by a light-transmissive member containing a wavelength converting material.

The light emitting device according to certain embodiments of the present invention does not require a large voltage even with an increase in the number of light emitting elements and can achieve a uniform distribution of light. The method of manufacturing a light emitting device according to certain embodiments of the present invention allows for manufacturing of a light emitting device with a uniform distribution of light with simplified procedure.

DESCRIPTION OF THE EMBODIMENTS

Certain embodiments according to the present invention will be described below with reference to the accompanying drawings. It is to be noted that the light emitting device described below is intended for implementing the technical concept of the present invention, and the present invention is not limited to those described below unless otherwise specified. The sizes and the positional relationships of the members in each of the drawings are occasionally shown exaggerated for ease of explanation.

Configuration of Light Emitting Device

Figure 1:
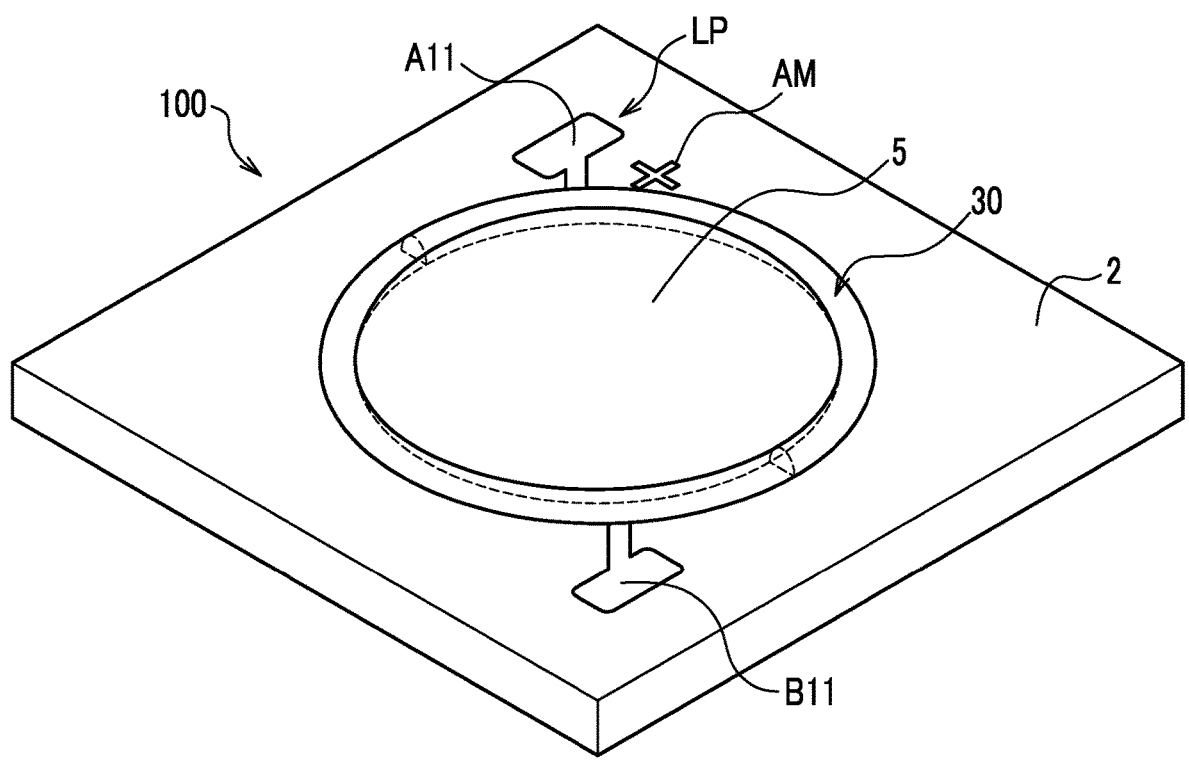
FIG. 1 is a perspective view schematically showing an entire of a light emitting device according to one embodiment of the present disclosure.

The configuration of the light emitting device 100 will be described below with reference to FIG. 1 to FIG. 3. For the simplicity of explanation, in the plan view in FIG. 2, the plurality of light emitting elements, the first wiring, the second wiring, etc., are shown see-through the light-transmissive member containing a wavelength converting material, the first wall, and the second wall. The light emitting device 100 is a chip on board (COB) type light emitting device having a plurality of light emitting elements 1 on a flat plate-shaped substrate 2. The light emitting device 100 includes, in a plan view: a quadrangular substrate 2; a wiring pattern LP formed with an anode-side wiring AL and a cathode-side wiring KL and disposed on the substrate 2, each of the anode-side wiring AL and the cathode-side wiring KL including a first wiring part 10 and a second wiring part 20, the first wiring parts surrounding a region and the second wiring parts 20 demarcating the region surrounded by the first wiring parts 10; a first wall 30 disposed along and covering the first wiring parts 10; and a second wall 40 disposed along and covering each of the second wiring parts 20; a plurality of light emitting elements 1; and a light-transmissive member 5 containing a wavelength converting material configured to cover the plurality of light emitting elements 1.

The light emitting device 100 has a light-emitting region EA surrounded by the first wiring parts 10 and demarcated by the second wiring parts 20 into a plurality of demarcated regions, for example, four demarcated regions of a first demarcated region SE1 to a fourth demarcated region SE4. Further, at least a portion of the at least one first wiring part 10 is an anode-side wiring and at least a portion of the at least one second wiring part 20 is a cathode-side wiring, or at least a portion of the at least one first wiring part 10 is a cathode-side wiring and at least a portion of the at least one second wiring part 20 is an anode-side wiring, demarcating each of the demarcated regions SE1 to SE4. In the light emitting device 100, the light emitting elements 1 and optionally one or more other components are electrically connected by wires 8 (in series to form at least one serial connection, hereinafter may be referred to as "string", of the light emitting elements) in each of the first demarcated region SE1 to the fourth demarcated region SE4 such that a plurality of strings of the light emitting elements in each of the demarcated region SE1 to the fourth demarcated region SE4 are connected in parallel to the anode-side wiring and the cathode side wiring. Each component member will be discussed below.

Light Emitting Element

For the light emitting elements 1, LED chips may be employed. Each of the LED chips has a semiconductor layered body of an n-type semiconductor layer, an active layer, and a p-type semiconductor layer disposed on a main surface of an element substrate, and configured to emit light upon being supplied with an electric current through an n-side electrode and a p-side electrode. A plurality of the light emitting elements 1 are disposed at a substantially equal interval in each of the demarcated regions SE1 to SE4 of the light emitting region EA on the upper surface of the substrate 2. For example, sixty light emitting elements 1 are disposed in each of the first demarcated region SE1 to the fourth demarcated region SE4. The light emitting elements 1 are bonded on an upper surface of the substrate 2 by using an electrically insulating bonding member such as silicone resin, with a surface opposite from the surface where electrodes are provided. The plurality of light emitting elements 1 are divided and disposed in each of the demarcated regions of the first demarcated region SE1 to the fourth demarcated region SE4 between the first wiring part 10 and the second wiring part 20, in which at least four strings of light emitting elements are electrically connected by wires in series. An equal number of the light emitting elements are preferably connected in the at least four strings of series circuits in each of the first demarcated region SE1 to the fourth demarcated region SE4.

For example, the first demarcated region SE1 to the fourth demarcated region SE4 respectively have six series circuits of ten light emitting elements 1, which are connected in parallel with respect to the anode-side wiring AL and the cathode-side wiring KL. Thus, the entire light-emitting region EA includes 24 parallel connections. It is preferable that the light emitting elements 1 as a whole, a number of m light emitting elements 1 are connected in series and a number of n series connections are connected in parallel, in which, m and n are natural numbers satisfying m≤n. This arrangement allows for connection in series in a multi-lighting type light emitting device having a plurality of light emitting elements, which can reduce unevenness in brightness and/or in reliability. The number of the light emitting elements 1 connected in series is preferably 12 or less. In the present embodiment, the number of the light emitting elements 1 connected in series is ten, which is 5% or less with respect to a total number of the light emitting element 1 of the light-emitting region SE. This is because an increase in the number of the light emitting elements 1 connected in series requires a large voltage, which may limit the number of the light emitting elements 1 in the entire light-emitting region EA.

For the light emitting elements 1, any semiconductor light emitting elements which can emit light of a desired wavelength can be employed. For example, a light emitting element configured to emit light of a blue color or a green color, a nitride-based semiconductor ($In_XAl_YGa_{1-X-Y}N$, 0≤X, 0≤Y, X+Y≤1) or GaP can be used. For a light emitting element configured to emit a red light, GaAlAs, AlInGaP, or the like can be used as well as a nitride-based semiconductor element. Semiconductor light emitting elements made of materials other than those described above can also be used for the light emitting elements 1. According to the purpose and application, the composition, the color of emitting light, the size and the number of light emitting elements 1 can be selected appropriately. Each of the light emitting elements 1 preferably has positive and negative electrodes on a same surface side. Accordingly, the light emitting elements 1 can be mounted in a flip-chip configuration. In this case, a surface opposite to the surface having the electrodes serves as a main light extracting surface of each of the light emitting elements 1. When the light emitting elements 1 are mounted in a face-up configuration, the surface having the electrodes serves as a main light extracting surface.

Substrate

The substrate 2 is configured to mount electronic components such as the light emitting elements 1, and includes a base member and a wiring pattern LP including a first wiring portion 10 and a second wiring portion 20, disposed on an upper surface of the base member. The substrate 2 can have a rectangular plate-like shape in a plan view, but any appropriate shape can be employed. For example, the substrate 2 may have an outer shape in a circular shape or another polygonal shape. The base member of the substrate 2 is preferably made of an electrically insulating main material, which is also preferably a material hardly transmit light emitted from the light emitting elements 1 and external light. The base member is preferably made of a material having a certain degree of strength. Examples of such materials include ceramics such as alumina, aluminum nitride, and mullite, resins such as phenol resins, epoxy resins, polyimide resins, bismaleimide-triazine (BT) resins, and polyphthalamide (PPA) resins. The upper surface of the base member preferably has good light-reflecting properties at least in regions where the light emitting elements 1 to be mounted, and for which a light-reflecting layer formed with a metal such as Ag or Al, or white resin containing a white pigment may be preferably provided.

The wiring pattern LP is formed with an anode-side wiring AL and a cathode-side wiring KL. The anode-side wiring AL is a continuous wiring including an anode-pad A11 having a large width configured to be connected to the outside, an anode-side connection part 11c, an anode-side frame part A12, an anode-side first part A13, and an anode-side second part A14. The cathode-side wiring KL is a continuous wiring including a cathode-pad B11 having a large width configured to be connected to the outside, a cathode-side connection part 12c, a cathode-side frame part B12, a cathode-side first part B13, and a cathode-side second part B14. In the wiring pattern LP, a first wiring part 10 surrounding a light-emitting region EA is formed with the anode-side frame part A12 and the cathode-side frame part B12. Also, in the wiring pattern LP, a second wiring part 20 is formed with the anode-side first part A13 and the anode-side second part A14, the cathode-side first part B13, and the cathode-side second part B14. The second wiring part 20 is formed to demarcate the light-emitting region EA into adjacent demarcated regions of a first demarcated region SE1 to a fourth demarcated region SE4.

In the example shown in the present embodiment, the first wiring part 10 is formed in a substantially circular ring shape surrounding the light-emitting region EA. The first wiring part 10 is formed with the anode-side frame part A12 in a semicircular shape and the cathode-side frame part B12 in a semicircular ring shape, spaced apart from the anode-side frame part A12. As shown in FIG. 3, the first wiring part 10 is formed such that a first end portion 11a of the anode-side frame part A12 of the semicircular ring shape and a second end portion 12b of the cathode-side frame part B12 of the semicircular ring shape are spaced apart from and facing each other, and a second end portion 11b of the anode-side frame part A12 of the semicircular ring shape and a first end portion 12a of the cathode-side frame part B12 of the semicircular ring shape are spaced apart from and facing each other. The first wiring part 10 is disposed to surround the light-emitting region EA such that the light emitting elements 1 can be electrically connected to the first wiring part 10, and therefore, the first wiring part 10 is not needed to completely surround (i.e., closely surround) the light-emitting region EA.

The first wiring part 10 is connected to the anode-side first part A13 of the second wiring 20 at the first end portion 11a of the anode-side frame part A12. The first end portion 11a of the anode-side frame part A12 and the anode-side first part A13 are connected through a diagonal portion in a plan view, such that the anode-side wiring has a uniform width. The first wiring part 10 is connected to the cathode-side first part B13 of the second wiring 20 at the first end portion 12a of the cathode-side frame part B12. The first end portion 12a of the cathode-side frame part B12 and the cathode-side first part B13 are connected through a diagonal portion in a plan view, such that the cathode-side wiring has a uniform width.

At a predetermined location, the anode-side frame part A12 of the first wiring part 10 and the anode-pad A11 are connected by the anode-side connection wiring 11c. In the present embodiment, the anode-pad A11 is formed in a rectangular shape with rounded corners, but another appropriate shape may also be employed. At a predetermined location, the cathode-side frame part B12 of the first wiring part 10 and the cathode-pad B11 are connected by the cathode-side connection wiring 12c. In the present embodiment, the cathode-pad B11 is formed in a rectangular shape with rounded corners, but another appropriate shape may also be employed. The anode-pad A11 and the cathode-pad B11 are disposed substantially point symmetrical along a diagonal line of the substrate 2.

The second wiring part 20 is formed with a single line and includes the anode-side first part A13, the anode-side second part A14, the cathode-side first part B13, and the cathode-side second part B14. The second wiring part 20 is formed with a single line and includes the anode-side first part A13 connected to the anode-side frame part A12 of the anode-side first part 10 and the anode-side second part A14 connected to the anode-side first part A13, and the cathode-side first part B13 connected to the cathode-side frame part B12 of the first wiring part 10 and the cathode-side second part B14 connected to the cathode-side first part B13.

The anode-side first part A13 of the second wiring part 20 is formed with a single line and has two end portions each connected to a diagonal portion in a plan view, one of which is connected to the first wiring part 10 at an outer periphery of the light-emitting region EA and is disposed toward the center along a radius of the first wiring part 10, and substantially in parallel to one side of the substrate. The anode-side first part A13 is formed with a single line and together with a portion of the anode-side frame part A12 and the cathode-side second part B14, demarcates the first demarcated region SE1. The anode-side first part A13 is formed with a single line and demarcates between the first demarcated region SE1 and the second demarcated region SE2. The anode-side first part A13 and the cathode-side first part B13 are spaced apart from each other and formed in a straight line shape. The anode-side first wiring part A13 is formed with a single line having a width equal to the width of the anode-side frame part A12 and is connected to the anode-side frame part A12. The first demarcated region SE1 is a quarter of the light-emitting region EA and is demarcated from the second demarcated region SE2 by the anode-side first part A13.

The anode-side second part A14 is formed with a single line connected orthogonally to the anode-side first part A13 through the diagonal portion, and extends from the center portion toward a periphery of the light-emitting region EA. The anode-side second part A14 is formed with a single line extending proximate to the periphery of the light-emitting region EA such that an end 21b of the anode-side second part A14 is closely separated from the cathode-side frame part B12. The anode-side second part A14 is formed with a single line and together with a portion of the cathode-side frame part B12 and the anode-side first part A13, demarcates the second demarcated region SE2. The anode-side second part A14 is formed with a single line and demarcates between the second demarcated region SE2 and the third demarcated region SE3. The anode-side second part A14 and the cathode-side second part B14 are spaced apart from each other and formed in a straight line shape. The anode-side second part A14 is formed with a single line having a width equal to the width of the anode-side frame part A12 and the anode-side first part A13, such that the anode-side second part A14, the anode-side first part A13, the anode-side frame part A12, and the anode-side first part A13 are in the form of a single continuous line. The second demarcated region SE2 is a quarter of the light-emitting region EA and is demarcated from the third demarcated region SE3 by the anode-side second part A14.

The cathode-side first part B13 of the second wiring part 20 is formed with a single line and has two end portions each connected to a diagonal portion in a plan view, one of which is connected to the first wiring part 10 at an outer periphery of the light-emitting region EA, such that the cathode-side first part B13 extends from the periphery toward the center of the light-emitting region EA along a radius of the first wiring part 10 and substantially parallel to two sides of the substrate. The cathode-side first part B13 is formed with a single line and together with a portion of the cathode-side frame part B12 and the anode-side second part A14, demarcates the third demarcated region SE3. The anode-side first part B13 is formed with a single line and demarcates between the third demarcated region SE3 and the fourth demarcated region SE4. The cathode-side first part B13 and the anode-side first part A13 are spaced apart from each other and formed in a straight line shape. The cathode-side first wiring part B13 is formed with a single line having a width equal to the width of the cathode-side frame part B12 and is connected to the cathode-side frame part B12. The third demarcated region SE3 is a quarter of the light-emitting region EA and is demarcated from the fourth demarcated region SE4 by the cathode-side first part B13.

The cathode-side second part B14 is formed with a single line connected orthogonally to the cathode-side first part B13 through the diagonal portion, and extends from the center portion toward a periphery of the light-emitting region EA. The cathode-side second part B14 is formed with a single line extending proximate to the periphery of the light-emitting region EA such that an end 22b of the cathode-side second part B14 is closely separated from the anode-side frame part A12. The cathode-side second part B14 is formed with a single line and together with a portion of the anode-side frame part A12 and the cathode-side first part B13, demarcates the fourth demarcated region SE4. The cathode-side second part B14 is formed with a single line and demarcates between the fourth demarcated region SE4 and the first demarcated region SE1. The cathode-side second part B14 and the anode-side second part A14 are spaced apart from each other and formed in a straight line shape. The cathode-side second part B14 is formed with a single line having a width equal to the width of the cathode-side frame part B12 and the cathode-side first part B13, such that the cathode-side second part B14, the cathode-side first part B13, and the cathode-side frame part B12 are in the form of a single continuous line. The fourth demarcated region SE4 is a quarter of the light emitting region EA and is demarcated from the first demarcated region SE1 by the cathode-side second part B14.

A portion of the anode-side first wiring part 10 and a portion of the anode-side second wiring part 20 are continuously extended from the anode-side pad A11. A portion of the cathode-side first wiring part 10 and a portion of the cathode-side second wiring part 20 are continuously extended from the cathode-side pad B11. That is, each of the demarcated regions SE1 to SE4 is defined by corresponding parts of the first wiring part 10 and the second wiring part 20 such that at least a portion of the first wiring part 10 is the anode-side single line and at least a portion of the second wiring part 20 is the cathode-side single line, or at least a portion of the second wiring part 20 is the anode-side single line and at least a portion of the first wiring part 10 is the cathode-side single line. More specifically, the first demarcated region SE1 is demarcated by a portion of the anode-side frame part A12, the anode-side first part A13, and the cathode-side second part B14. The second demarcated region SE2 is demarcated by a portion of the cathode-side frame part B12, the anode-side first part A13, and the anode-side second part A14. The third demarcated region SE3 is demarcated by a portion of the cathode-side frame part B12, the anode-side second part A14, and the cathode-side first part B13. The fourth demarcated region SE4 is demarcated by a portion of the anode-side frame part A12, the cathode-side first part B13, and the cathode-side second part B14. Further, the first wiring part 10 and the second wiring part 20 shown in FIG. 2 are arranged in a point symmetry with respect to a center of the light-emitting region EA.

The wiring pattern LP including the first wiring part 10 and the second wiring part 20 can be formed by using, for example, one or more metals such as Cu, Ag, Au, Al, Pt, Ti, W, Pd, Fe, and Ni, or an alloy containing one or more such metals. The wiring pattern LP can be formed by using, for example, printing, electrolytic plating, electroless plating, vapor deposition, or sputtering.

In the second wiring part 20, when one or more among the anode-side first part A13, the anode-side second part A14, the cathode-side first part B13, and the cathode-side second part B14 are "spaced apart from other parts", the corresponding parts are arranged at a distance required for electrical insulation between the parts. The first demarcated region SE1 to the fourth demarcated region SE4 are demarcated by the second wiring part 20 such that a same number of the light emitting elements 1 can be arranged in each of the demarcated regions. Further, an anode mark AM may be provided near the anode-side pad A11 to identify the positive electrode (anode).

The first wiring part 10 and the second wiring part 20 are electrically connected to the light emitting elements 1 by wires 8. A protective element may be mechanically and electrically connected to the first wiring part 10 by an electrically conductive bonding member such as a solder, and electrically connected to the second wiring part 20 by a wire 8. In each of the demarcated regions, the wires 8 are provided such that the light emitting elements 1 are electrically connected to the anode-side first wiring part 10 and to the cathode-side second wiring part 20, or to the anode-side second wiring part 20 and to the cathode-side first wiring part 10. The wires 8 are provided to electrically connect the light emitting elements 1 to obtain plurality of strings of the light emitting elements 1, and in the present embodiment, ten light emitting elements 1 are connected in series by the wires 8 to obtain six strings of light emitting elements 1. In each of the demarcated regions SE1 to SE2, the strings of the light-emitting elements 1 are connected to the first wiring part 10 and the second wiring part 20 by the wires 8 such that the strings of the light emitting elements 1 are connected in parallel to each other. The strings of the light emitting elements 1 connected by wires 8 are disposed corresponding to the shape of each of the demarcated regions SE1 to SE4, the light emitting elements 1 are not necessarily be arranged in a square matrix, but each of the demarcated regions SE1 to SE4 includes a same number of strings respectively include a same number of the light emitting elements 1.

Figure 2:
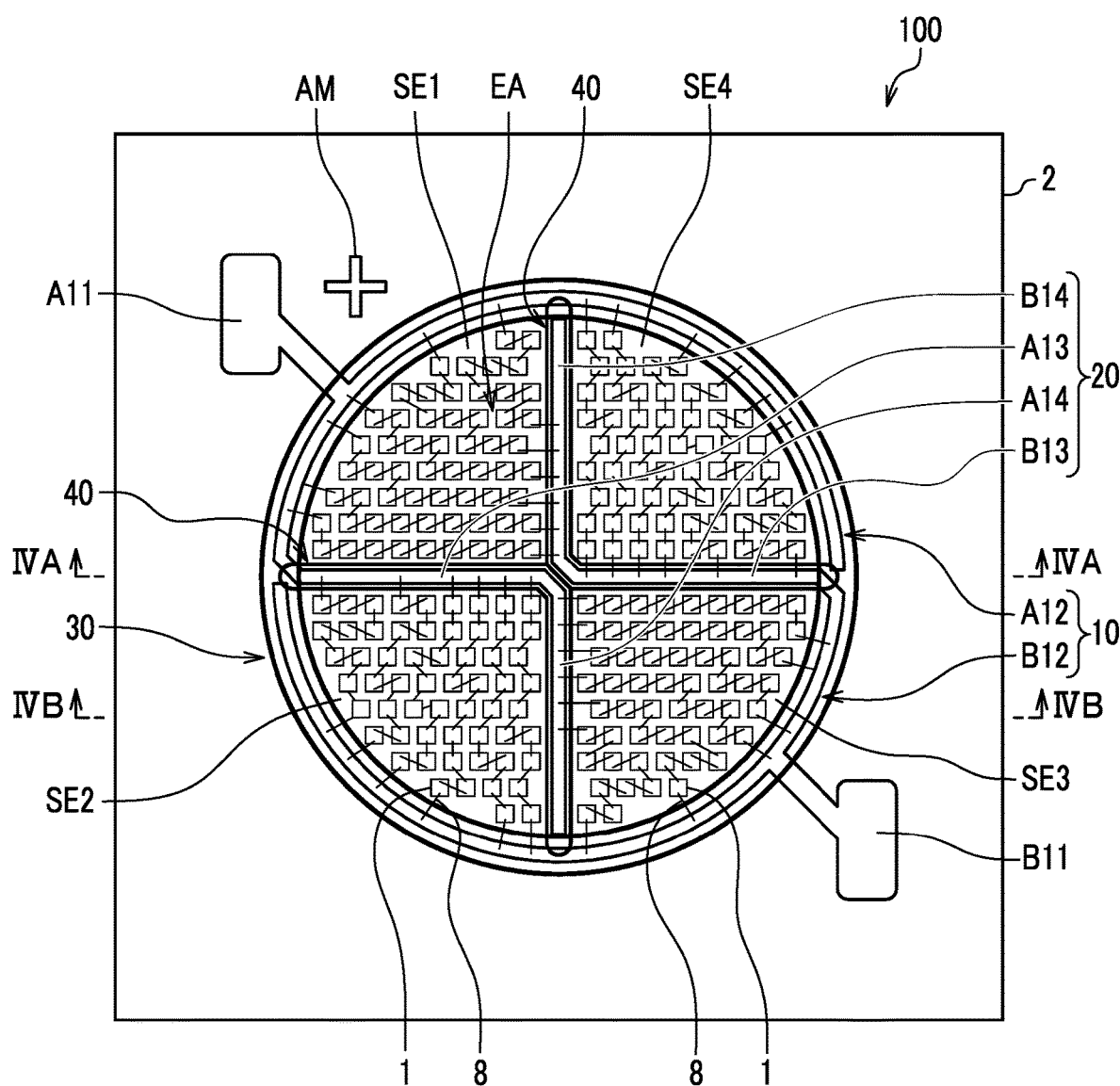
FIG. 2 is a schematic plan view, viewed through the light-transmissive member, of a plurality of light emitting elements, wirings, the first wiring, and the second wiring, of the light emitting device according to one embodiment of the present disclosure.
Figure 3:
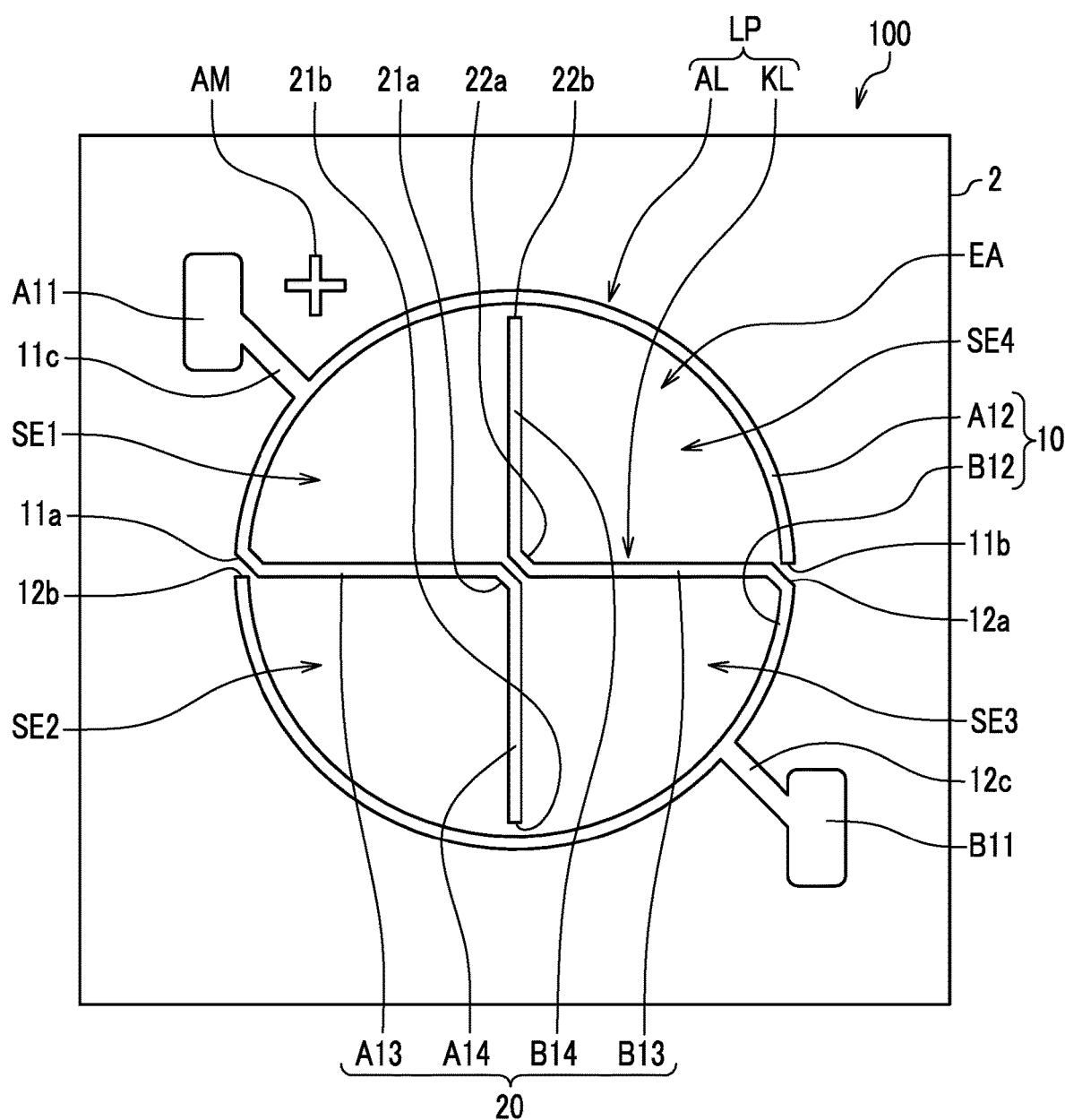
FIG. 3 is a plan view schematically showing a wiring pattern of the light emitting device according to one embodiment of the present disclosure.
Figure 4A:
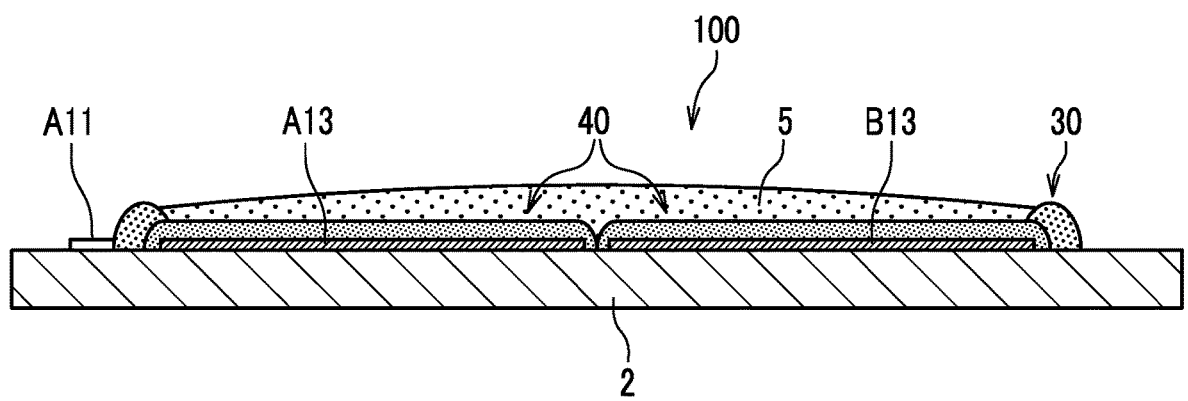
FIG. 4A is a schematic cross-sectional view taken along line IVA-IVA of FIG. 2.
Figure 4B:
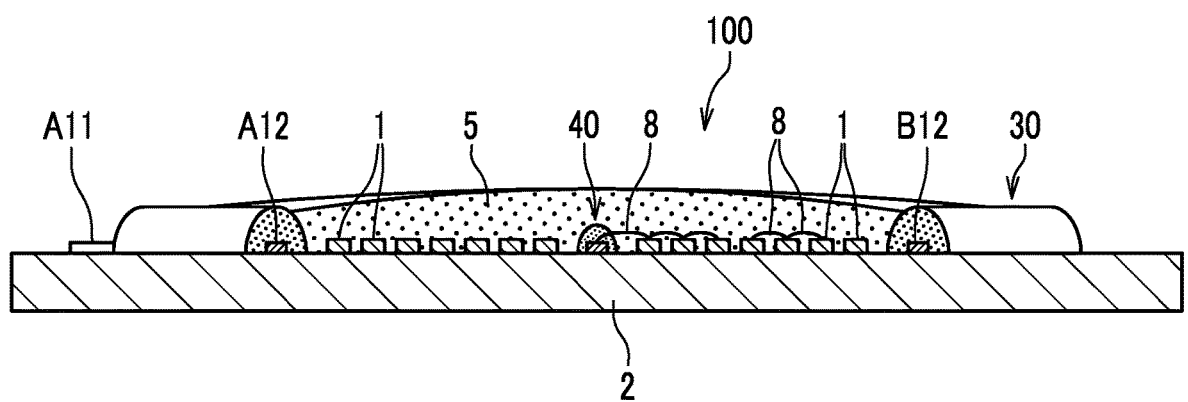
FIG. 4B is a schematic cross-sectional view taken along line IVB-IVB of FIG. 2.
Figure 5:
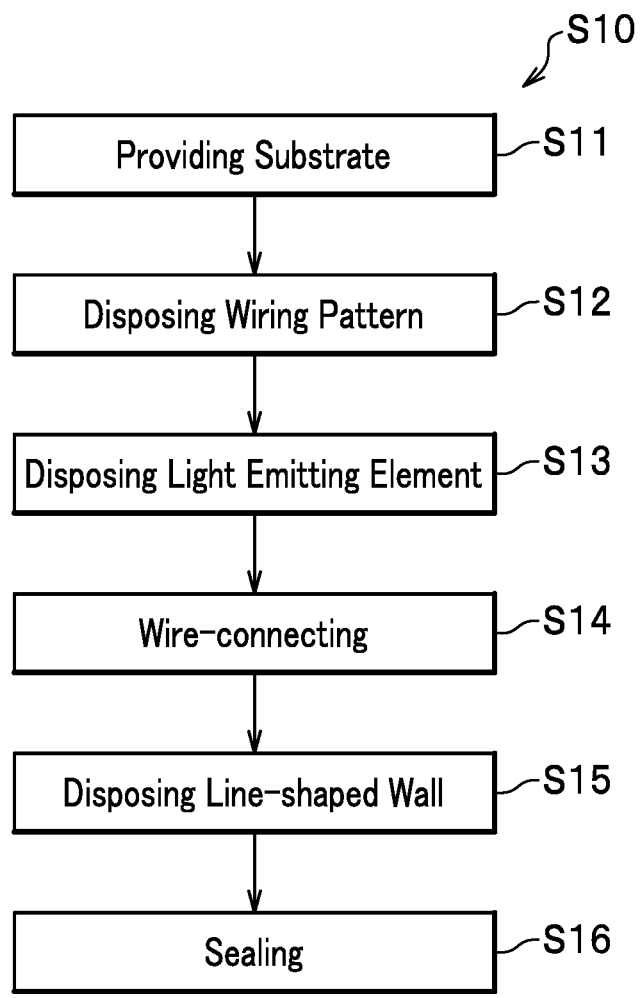
FIG. 5 is a flow chart showing a procedure of a method of manufacturing a light emitting device according to one embodiment of the present disclosure.

When the light-emitting region EA is demarcated by the first wiring part 10 and the second wiring part 20 into a plurality of demarcated regions, other than the configuration shown in FIG. 2. The demarcated regions may be provided as those to be described below, or an appropriate wiring pattern LP can be employed according to the arrangement of the strings of the light emitting elements 1 and/or a configuration of electrical connection of the light emitting elements 1. A configuration allowing mounting the light emitting elements 1 in a flip-chip manner can also be employed.

First Wall, Second Wall

The first wall 30 is formed along and covering the first wiring 10. The second wall 40 is formed along and covering the second wiring 20. The first wall 30 and the second wall 40 can be formed with a resin. The first wall 30 is formed in a circular ring shape. Also, the first wall 30 is formed with a width larger than a width of the first wiring 10 and with a predetermined height with respect to the base plate 2. In the present embodiment, the first wall 30 is formed to cover adjacent end portions of the second wall 40. The first all 30 has a thickness (or a width) preferably in a range of 0.5 to 1.5 mm, more preferably in a range of 0.8 to 1.2 mm. The first wall 30 can be formed with a light-reflecting resin such as phenol resin, epoxy resin, BT resin, PPA resin, or silicone resin, that contains a light-reflecting member such as $TiO_2$, $Al_2O_3$, $ZrO_2$, or MgO.

The second wall 40 is formed along and covering the first anode wiring A13 and the second anode wiring A14 of the second wiring 20, and also along and covering the first cathode wiring B13 and the second cathode wiring B14. The second wall 40 is made of two L-shaped parts each having an angled corner (a bend) and adjacent to each other at the angled corners such that straight line-shaped portions of the two L-shaped parts are arranged in a cross shape. Arranging the two-L-shaped parts adjacent to each other at the angled corners, the second wall 40 can be formed with a certain height without overlapping with each other at the center.

The second wall 40 can be formed with a height smaller than the height of the first wall 3. This arrangement can facilitate avoiding the second wall 40 drooping outward over the first wall 30, when the second wall 40 is formed overlapped with the first wall 30. Further, forming the second wall 40 with a smaller width allows for obtaining of more uniform distribution of light in the light-emitting region. The thickness (or width) of the second wall 40 is preferably in a range of 0.3 to 1.4 mm, more preferably in a range of 0.5 to 1.1 mm.

The second wiring 20 is formed with a single line, such that the second wall 40 can be formed with a smaller thickness (or width). Accordingly, with the second wall 40, boundary parts between adjacent demarcated regions SE1 to SE4 can be reduced, which allows for reducing the spot(s) perceivable in the emission distribution in the entire light emitting region EA.

The second wall 40 can be formed with a light-reflecting resin such as phenol resin, epoxy resin, BT resin, PPA resin, or silicone resin, that contains a light-reflecting member such as $TiO_2$, $Al_2O_3$, $ZrO_2$, or MgO. For the second wall 40, material(s) used for the first wall 30 is preferably used. The second wall 40 may contain a coloring agent, a light diffusing agent, or the like. When the second wall 40 is formed with a light-transmissive resin, colors of light emitted from the light emitting elements 1 located in adjacent demarcated regions can be mixed in the second wall 40.

The entire region surrounded by the first wall 30 substantially serves as the light emitting region EA, which is demarcated by the second wall 40, such that a first demarcated region SE1, a second demarcated region SE2, a third demarcated region SE3, and a fourth demarcated region SE4 are formed in the light-emitting region EA. In the present embodiment, the region surrounded by the first wall 30 has a circular shape, but with the first wiring 10, a polygonal shape such as a quadrangular shape, a hexagonal shape, or an octagonal shape may be employed. Also, a configuration having four regions has been described as the plurality of demarcated regions, but the region surrounded by the first wall 30 can be separated into two region, three region, or five or more regions by demarcating the region by the second wall 40 with the second wiring parts 20.

Light Transmissive Member

The light-transmissive member 5 is disposed to cover entire of the light emitting elements 1 arranged in the demarcated regions SE1 to SE4 of the light-emitting region EA. The light-transmissive member 5 is formed with a light-transmissive resin containing a wavelength converting material such as a fluorescent material. The light-transmissive member 5 is configured to seal the first light emitting elements 1 and the wires 8 disposed in the first demarcated region SE1 to the fourth demarcated region SE4 the substrate 2, to protect those components from dust, moisture, gases, external forces, or the like. The wavelength converting material contained in the light-transmissive member 5 can be such that a same color of light is emitted from each of the demarcated regions SE1 to SE4, or the wavelength converting material is contained corresponding to one of the demarcated regions. When particles of the wavelength converting material are contained in the light-transmissive member 5, the particles are preferably distributed in a bottom portion of the light-transmissive member 5, that is, near the surfaces of the light emitting elements 1. With this arrangement, the efficiency of wavelength conversion can be increased.

The light-transmissive member 5 is disposed in the region surrounded by the first wall 30 to a height similar to the height of the first wall 30, such that the light-transmissive member 5 has a height higher at a center portion than at a peripheral portion adjacent to the first wall 30. The light-transmissive member 5 is preferably formed with a material having a refractive index similar to that of the second wall 40. With this arrangement, an optical interface is not created between the light-transmissive member 5 and the second wall 40, facilitating propagation of light between the light-transmissive member 5 and the second wall 40.

The material of the sealing member 5 preferably has good light-transmissive property, good weather resistant property, and good light-resisting property, and for example, a thermosetting resin such as a silicone resin, an epoxy resin, and a urea resin can be suitably used.

When a wavelength converting material is contained in the light-transmissive member 5, a material that can absorb light from the light emitting elements 1 and convert the wavelength of the light can be employed. The wavelength converting material contained in the light-transmissive member 5 preferably has a specific gravity greater than that of the resin material used for light-transmissive member 5. With the use of the wavelength converting material having a specific gravity greater than that of the resin material, particles of the wavelength converting material can be precipitated in the light-transmissive member 5 in manufacturing, so that the wavelength converting material can be disposed near the surfaces of the light emitting elements 1.

Specific examples of the wavelength converting material include a yellow fluorescent material such as YAG ($Y_3Al_5O_{12}$:Ce) and silicate, and a red fluorescent material such as CASN ($CaAlSiN_3$:Eu) and KSF ($K_2SiF_6$:Mn).

The light-transmissive member 5 may further contain a filler material. For such a filler material, for example, particles of $SiO_2$, $TiO_2$, $Al_2O_3$, $ZrO_2$, MgO or the like can be suitably used. Further, for example, an organic or inorganic coloring dye or coloring pigment may be contained in the light-transmissive member 5.

The light emitting device 100 with such structures can project light on a projection plane with a uniform light distribution or a uniform light distribution pattern. For example, when all the light emitting elements 1 of the light emitting device 100 are caused to emit light, substantially uniform light distribution can be obtained in the entire light-emitting region EA.

Method of Manufacturing

Next, a method of manufacturing the light emitting device 100 will be described with reference to FIG. 5, FIG. 6A through FIG. 6F. In the manufacturing, a plurality of light emitting devices 100 are processed at the same time, but in the description below, a single state of a single light emitting device 100 will be illustrated with reference to FIG. 6B through FIG. 6G. As an example of demarcating the light-emitting region EA into a plurality of demarcated regions, demarcating to form the first demarcated region SE1 to the fourth demarcated region SE4 will be illustrated.

The method of manufacturing light emitting device S10 includes providing substrate S11, disposing wiring pattern S12, disposing element S13, wire connecting S14, forming line-shaped walls S15, and sealing S16, which are preferably performed in this order.

In the step of providing substrate S11, a plate-like material for a base member will be performed. For example, a collective substrate having a metal film disposed on an entire upper surface of an electrically insulating base member can be used. Such a collective substrate has dimensions that allows obtaining of a plurality of substrates 2 for a plurality of light emitting devices 100.

Figure 6A:
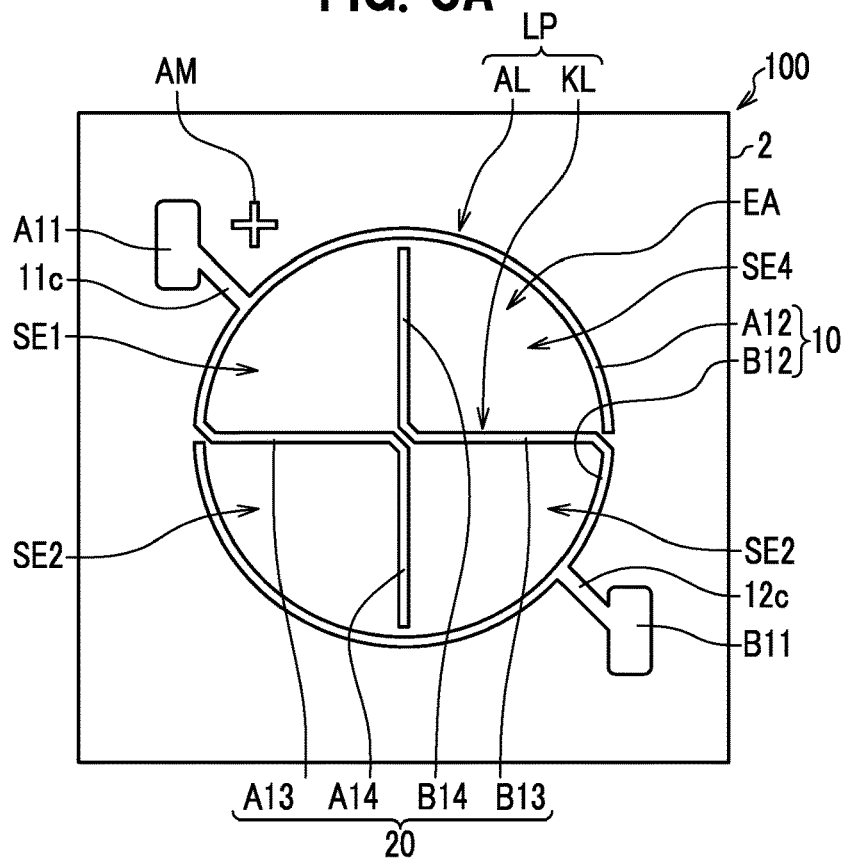
FIG. 6A is a schematic plan view showing a substrate with a wiring pattern disposed in a step of disposing wiring pattern in a method of manufacturing a light emitting device according to one embodiment of the present disclosure.

As shown in FIG. 6A, in the step of disposing wiring pattern S12, a wiring pattern LP is disposed at locations corresponding to the substrates 2 of the collective substrate. In the step of disposing a wiring pattern S12, first wiring parts 10 surrounding corresponding light-emitting regions EA on the substrates 2 and second wiring parts 20 connected to the first wiring parts 10 and demarcating the light-emitting regions EA into a plurality of demarcated regions SE1 to SE4 are disposed. The wiring pattern LP can be formed, for example, by printing or by using a subtracting method, in which a metal film is disposed on the entire upper surface of the collective substrate, a mask is disposed on the metal film so as to cover a region to be left on the metal film as the wiring patterns, and uncovered portion of the metal film is etched.

Figure 6B:
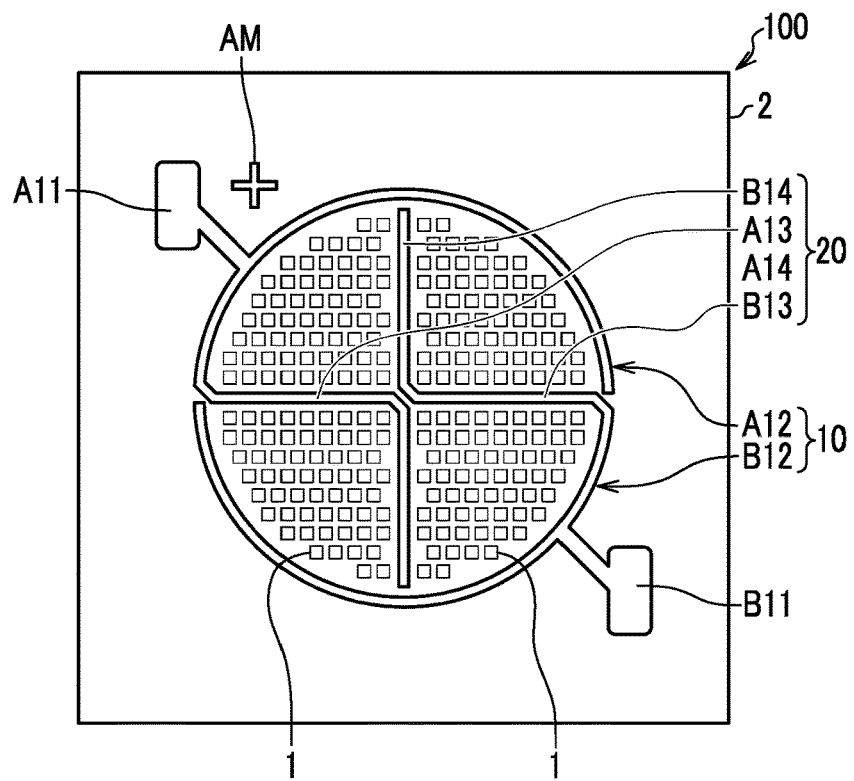
FIG. 6B is a plan view schematically showing a plurality of light emitting elements disposed on the substrate in a step of disposing light emitting elements in the method of manufacturing the light emitting device according to one embodiment of the present disclosure.

As shown in FIG. 6B, in the step of disposing elements, a plurality of predetermined number of the light emitting elements 1 are disposed in each of the first demarcated region SE1 to the fourth demarcated region SE4 of the light-emitting region EA, demarcated by the second wiring parts 20 and surrounded by the first wiring part 10. In the step of disposing elements S13, light emitting elements 1 are disposed in the first demarcated region SE1 to the fourth demarcated region SE4 such that, for example, ten light emitting elements 1 are connected in series as a single string and six strings of the light emitting elements 1 are disposed in each of the demarcated regions SE1 to SE4. The light emitting elements 1 are bonded on an upper surface of the substrate 2 by using an electrically conductive or insulating bonding member such as a solder or a die bonding resin.

Figure 6C:
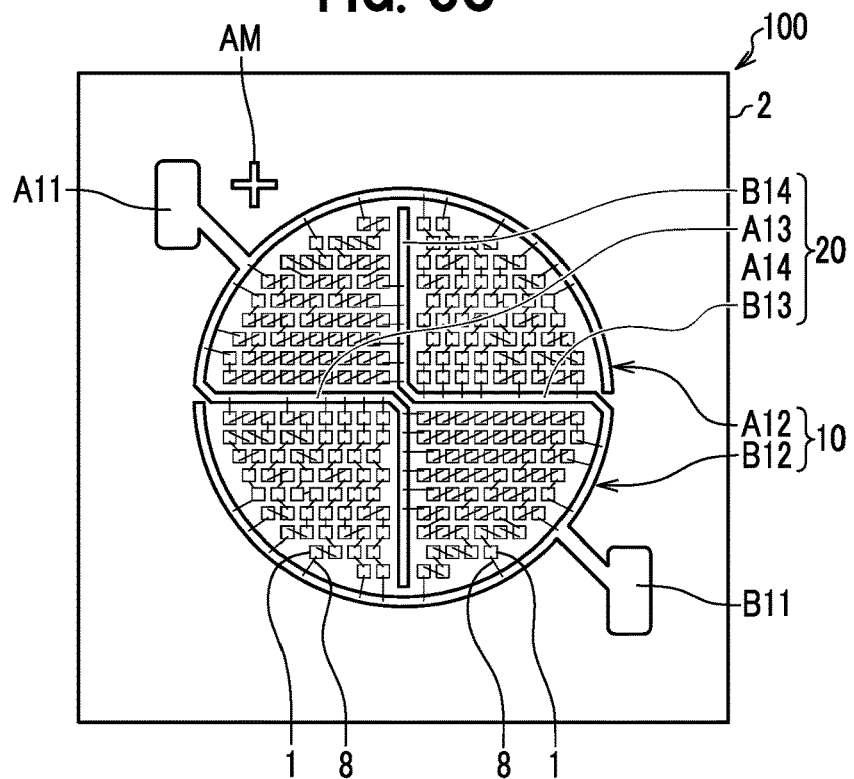
FIG. 6C is a plan view schematically showing wirings connecting the plurality of light emitting elements, in a step of disposing wirings in the method of manufacturing the light emitting device according to one embodiment of the present disclosure.

As shown in FIG. 6C, in the step of wire connecting S14, the light emitting elements 1 are electrically connected with the wires 8. In the step of wire connecting S14, in each of the first demarcated region SE1 to the fourth demarcated region SE4, ten of the light emitting elements 1 are electrically connected in series with the wires 8 as a single string, and using wires 8, six strings of the light emitting elements 1 are electrically connected in parallel to the first wiring part 10 and the second wiring part 20, which are respectively the anode-side wiring and the cathode side wiring.

In the step of disposing elements S13, a protective element may be mounted on the substrate 2 and electrically connected in the step of connecting wires S14.

Figure 6D:
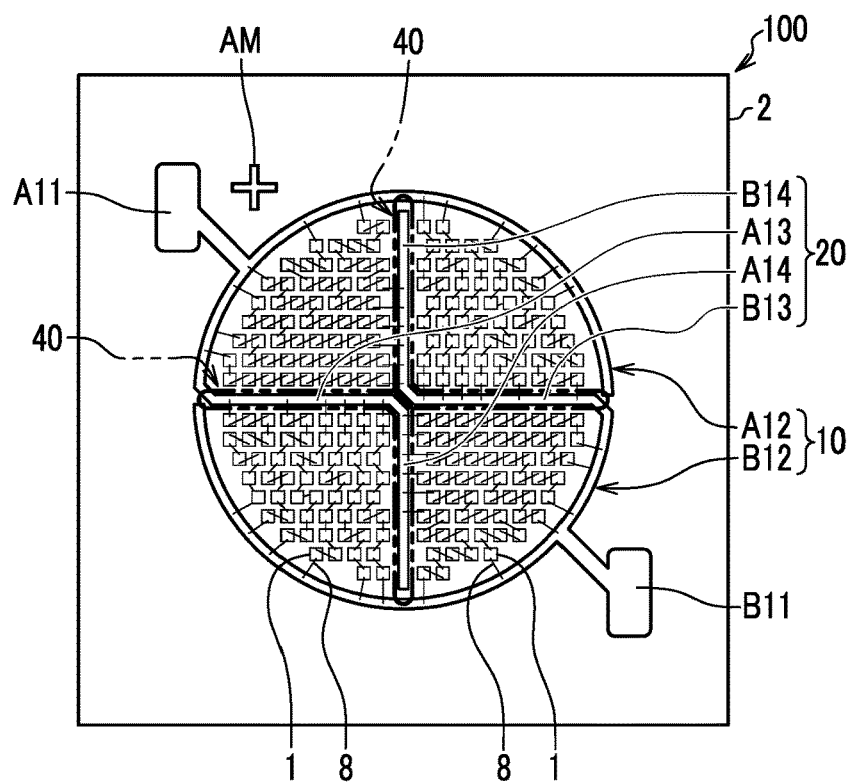
FIG. 6D is a plan view schematically showing a second wall disposed on the second wiring in a step of forming a line-shaped wall in the method of manufacturing the light emitting device according to one embodiment of the present disclosure.
Figure 6E:
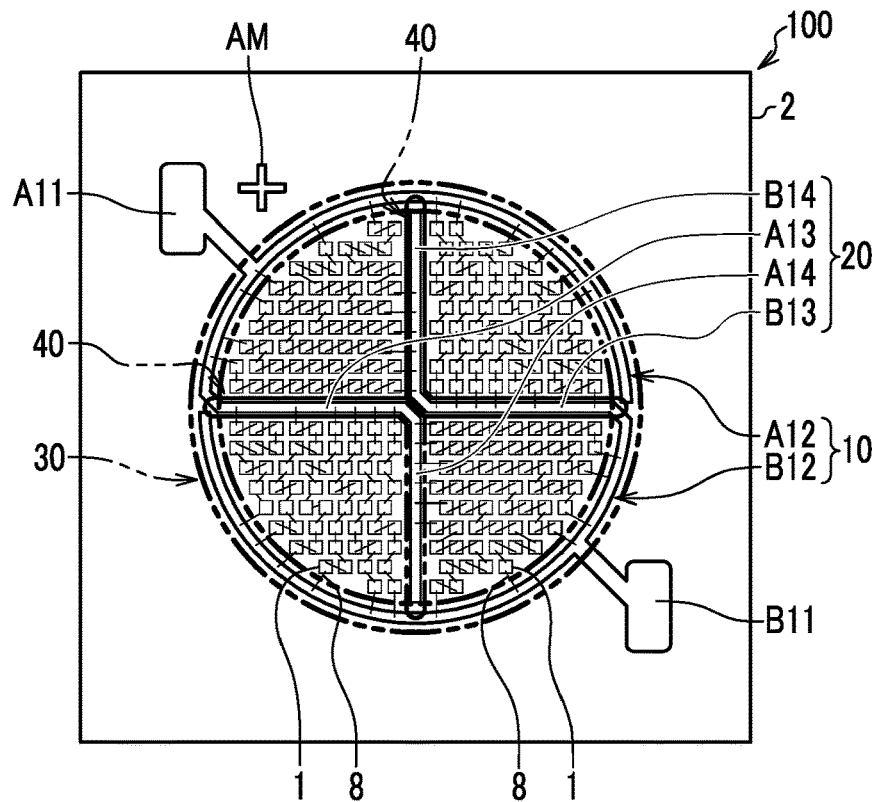
FIG. 6E is a schematic plan view showing a first wall disposed on the first wiring in a step of forming a line-shaped wall in the method of manufacturing the light emitting device according to one embodiment of the present disclosure.

As shown in FIG. 6D and FIG. 6E, in the step of forming line-shaped walls S15, a first wall 30 is disposed along and covering the first wiring part 10 and a second wall 40 is disposed along and covering the second wiring part 20. In the step of forming line-shaped walls S15, it is preferable to form a second wall 40 before forming a first wall 30. As shown in FIG. 6D, each of the second walls 40 is formed in an L-shape by supplying a material of the second wall 40, for example, a thermosetting resin is supplied in a line shape through a dispenser along on the anode-side first part A13 and the anode-side second part A14, and along on the cathode-side first part B13 and the cathode-side second part B14. The second walls 40 are formed so as not to overlap with each other at the bend of the "L" (that is, at center portion of the light-emitting region EA), such that the second walls 40 have a substantially uniform height. In the forming of the second walls 40, at the each end of the L-shape, the resin material is preferably supplied to overlap a portion of, but not to extend outward from the first wiring part 10.

As shown in FIG. 6E, after forming the second walls 40, the first wall 30 is formed in a circular ring shape along and covering the first wiring part 10. In the forming of the first wall 30, for example, the same thermosetting resin as used in the second walls 40 can be used, and with a dispenser having a wider opening than that used in the second walls 40, the first wall 30 can be formed with a width larger than that of the second walls 40. The first wall 30 is formed to cover the ends of the second walls 40 such that the second wiring part 20 can be reliably covered.

The viscosity of the liquid resin material of the thermosetting resin is adjusted such that the first wall 30 and the second walls 40 can be formed with the heights greater than the heights of the light emitting elements 1 and with the widths that can cover the wirings disposed in a circular ring shape and an L-shape. Subsequently, a heat treatment is carried out to cure the resin material to form the first wall 30 and the second walls 40. The viscosity of the liquid resin material can be also adjusted by the amount of the solvent used for the resin material and the amount of the filler that is optionally added.

Figure 6F:
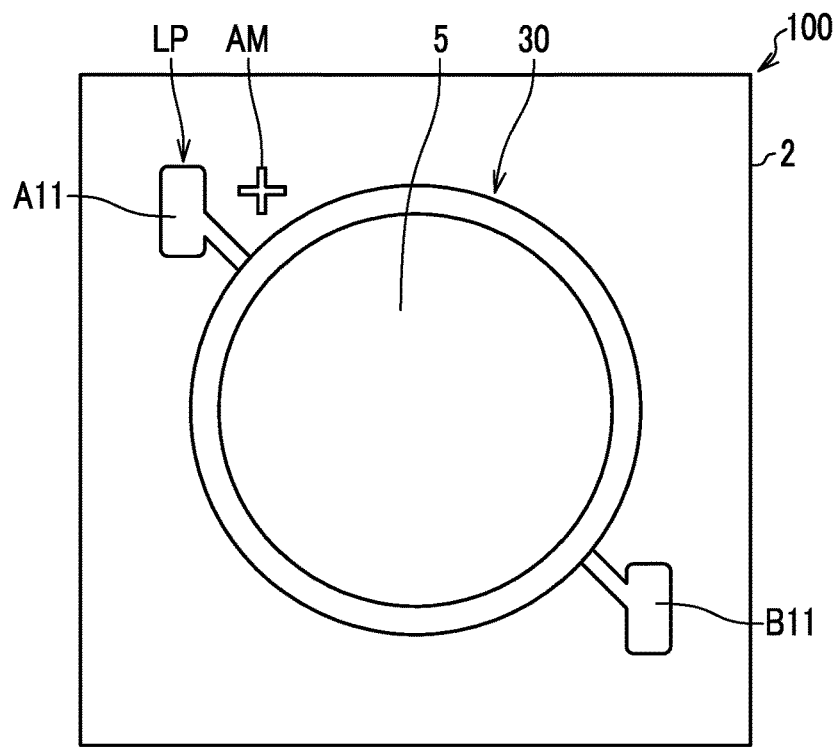
FIG. 6F is a plan view schematically showing a light-transmissive member containing a wavelength converting material in a step of sealing in the method of manufacturing the light emitting device according to one embodiment of the present disclosure.

As shown in FIG. 6F, in the step of sealing S16, the light emitting elements 1, the wires 8, etc., in the light-emitting region EA surrounded by the first wall 30 are covered by a resin material. In the step of sealing S16, a light-transmissive member 5 containing a wavelength converting material is supplied inward of the first wall 30 to cover an entire of the light-emitting region EA located inward of the first wiring part 10. In the step of sealing S16, a light-transmissive member 5 containing a wavelength converting material and a light-transmissive member 5 that does not contain a wavelength converting material may be supplied one after another. As such, when the light-transmissive member 5 is disposed in layers, each layer can contain different wavelength converting materials and/or different filler materials, or different wavelength converting materials may be supplied for each of the demarcated regions of the light-emitting region EA.

Next, variational examples of the light emitting device 100 will be described below with reference to FIG. 7A to FIG. 7E. The light-emitting region EA of the light emitting device is demarcated in a plurality of demarcated regions, such as two demarcated regions, three demarcated regions, five demarcated regions, or six demarcated regions. The same reference numerals may be applied to the components that have been described above and description thereof may be appropriately omitted.

Figure 7A:
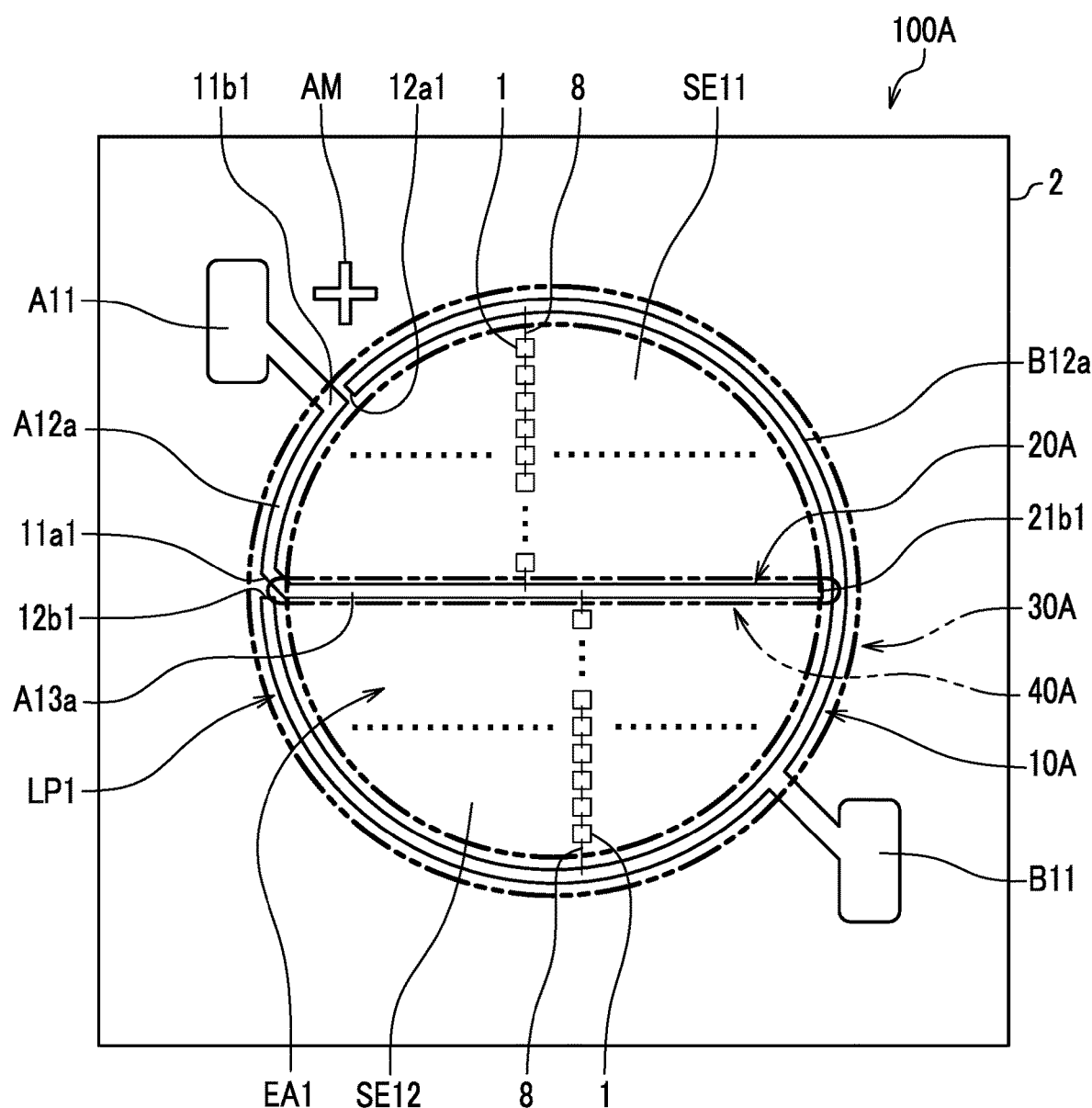
FIG. 7A is a schematic diagram showing a first variational example in which two demarcated regions are employed as a plurality of light-emitting regions of the light emitting device according to one embodiment of the present disclosure.

As shown in FIG. 7A, the light-emitting region EA1 may be demarcated into two regions of a first demarcated region SE11 and a second demarcated region SE12. The wiring pattern LP1 includes an anode-side pad A11, an arc-shaped anode-side frame part A12a, an anode-side first part A13a, a cathode-side pad B11, and an arc-shaped cathode-side frame part B12a.

In the wiring pattern LP1, the first wiring part 10A is formed with a single line and includes the arc-shaped anode-side frame part A12a and the arc-shaped cathode-side frame part B12a. In the wiring pattern LP1, the second wiring part 20A is formed with a single line of the anode-side first part A13a. A same number of the light emitting elements 1 are disposed in each of the first demarcated region SE11 and the second demarcated region SE12. In the first demarcated region SE11, a plurality of strings of the light emitting elements 1 connected with wires 8 in series are connected to the anode-side first part A13a and the cathode-side frame part B12a with the wires 8. In the second demarcated region SE12, a plurality of strings of the light emitting elements 1 connected with wires 8 in series are connected to the anode-side first part A13a and the cathode-side frame part B12a with the wires 8 in parallel.

The anode-side first part A13a is formed with a single line and extended through the center of the first wiring part 10A that is formed in a substantially circular ring shape and substantially parallel to a side of the substrate 2. The anode-side first part A13a is connected to the anode-side frame part A12a through a diagonal portion at a first end portion 11a1, and is closely separated from the cathode-side frame part B12a at a second end portion 21b1. The strings of the light emitting elements 1 disposed in the first demarcated region SE11 and the second demarcated region SE12 are respectively connected to the anode-side first part A13a through wires 8.

The anode-side frame part A12a is formed to adjust the location of the anode-pad A11 with respect to the anode-side first part A13a, such that a wire 8 may not be connected, but the anode-side frame part A12a can serve a similar function as the anode-side first part A13a.

As shown in FIG. 7A, the first wall part 30A is formed in a substantially circular ring shape along and covering the anode-side frame part A12a and the cathode-side frame part B12a, with a substantially uniform width that is larger than the width of the second wall 40A. The second wall part 40A is formed along and covering the anode-side first part A13a located along a diameter of the first wall part 30A having the substantially circular ring shape, in a straight line shape with a substantially uniform width that is smaller than the width of the first wall part 30A and substantially parallel to one side of the substrate 2.

The second wall part 40A is formed prior to the first wall part 30A and a portion of each of the end portions of the second wall 40A covering the first end portion 11a1 and the second end portion 12a1 of the anode-side first part A13a are covered by the first wall part 30A. A light-transmissive member 5 containing a wavelength converting material is disposed inward of the first wall part 30A.

In the light emitting device 100A, the second wiring part 20A is formed with the anode-side first part A13a, but the second wiring part may be formed with the cathode-side first part.

Figure 7B:
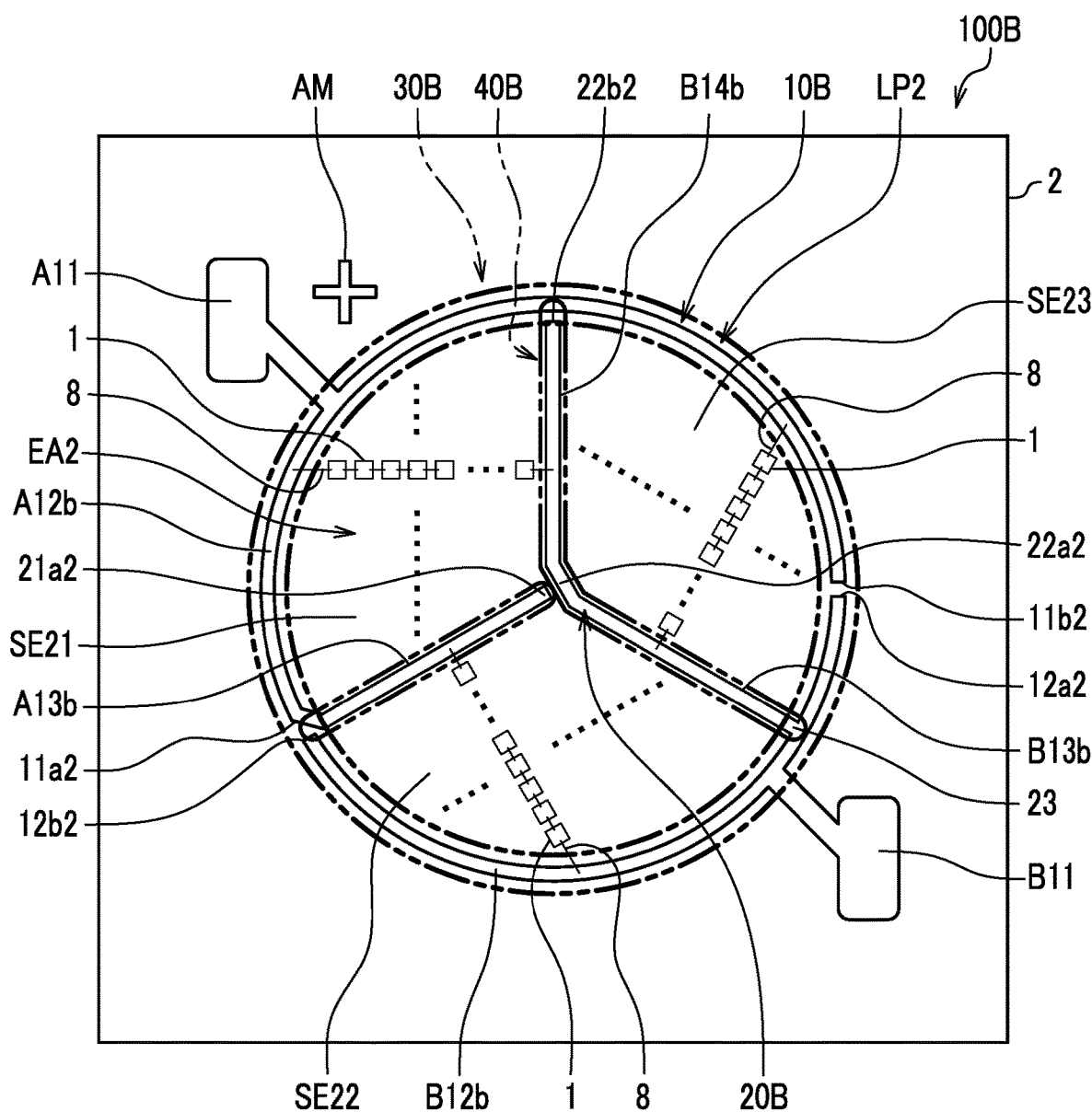
FIG. 7B is a schematic diagram showing a second variational example in which three demarcated regions are employed as a plurality of light-emitting regions of the light emitting device according to one embodiment of the present disclosure.

As shown in FIG. 7B, the light-emitting region EA2 may be demarcated into three regions of a first demarcated region SE21, a second demarcated region SE22, and a third demarcated region SE23. The wiring pattern LP2 is formed with a single line and includes an anode pad A11, an arc-shaped anode-side frame part A12b, an anode-side first part A13b, a cathode pad B11, an arc-shaped cathode-side frame part B12b, a cathode-side first part B13b, and a cathode-side second part B14b.

In the wiring pattern LP2, the first wiring part 10B is formed with a single line and includes an arc-shaped anode-side frame part A12b and an arc-shaped cathode-side frame part B12b. In the wiring pattern LP2, the second wiring part 20B is formed with a single line and includes an anode-side first part A13b, a cathode-side first part B13b, and a cathode-side second part B14b. A same number of the light emitting elements 1 are disposed in each of the first demarcated region SE21 to the third demarcated region SE23. In the first demarcated region SE21, a plurality of strings of the light emitting elements 1 connected with wires 8 in series are connected to the cathode-side second part B14b and the anode-side frame part A12b with the wires 8 in parallel. In the second demarcated region SE22, a plurality of strings of the light emitting elements 1 connected with wires 8 in series are connected to the anode-side first part A13b and the cathode-side frame part B12b with the wires 8 in parallel. In the third demarcated region SE23, a plurality of strings of the light emitting elements 1 connected with wires 8 in series are connected to the cathode-side second part B14b and the anode-side frame part A12b with the wires 8 in parallel.

The first wall part 30B is formed in a substantially circular ring shape along and covering the anode-side frame part A12b and the cathode-side frame part B12b, with a substantially uniform width that is larger than the width of the second wall part 40B. The second wall part 40B demarcates the region inward of the circular ring first wall part 30B into three demarcated regions of 120 degrees, and covers the second wiring part 20B of the anode-side first part A13b, the cathode-side first part B13b, and the cathode-side second part B14b, with a width smaller than the width of the first wall part 30B.

The second wall part 40B is preferably formed prior to the first wall part 30B. The second wall part 40B is formed along and covering a connection end-part 23 of the cathode-side first part B13b connected to the cathode-side frame part B12b, a straight line-shaped portion of the cathode-side first part B13b, a central connection part 22a2 between the cathode-side first part B13b and a cathode-side second part B14b, a straight line-shaped portion of the cathode-side second part B14b, and an end portion 22b2 of the cathode-side second part B14b. Further, the second wall part 40B is formed along and covering a straight line-shaped portion of the anode-side first part A13b.

After the second wall part 40B and the first wall part 30B are formed, a light-transmissive member 5 containing a wavelength converting material is disposed inward of the first wall part 30B. In the light emitting device 100B, anode-side of the second wiring part 20B is formed with the anode-side first part A13b, cathode-side of the second wiring part 20B is formed with the cathode-side first part B13b and the cathode-side second part B14b, but cathode-side of the second wiring part 20B may be formed with the cathode-side first part and anode-side second wiring part 20B may be formed with an anode-side first part and an anode-side second part. The third demarcated region SE23 is demarcated with a frame part formed with the anode-side frame part A12b and the cathode-side frame part B12b, such that the frame part demarcating a demarcated region may be formed with an anode-side frame part and a cathode-side frame part that are separated from each other.

Figure 7C:
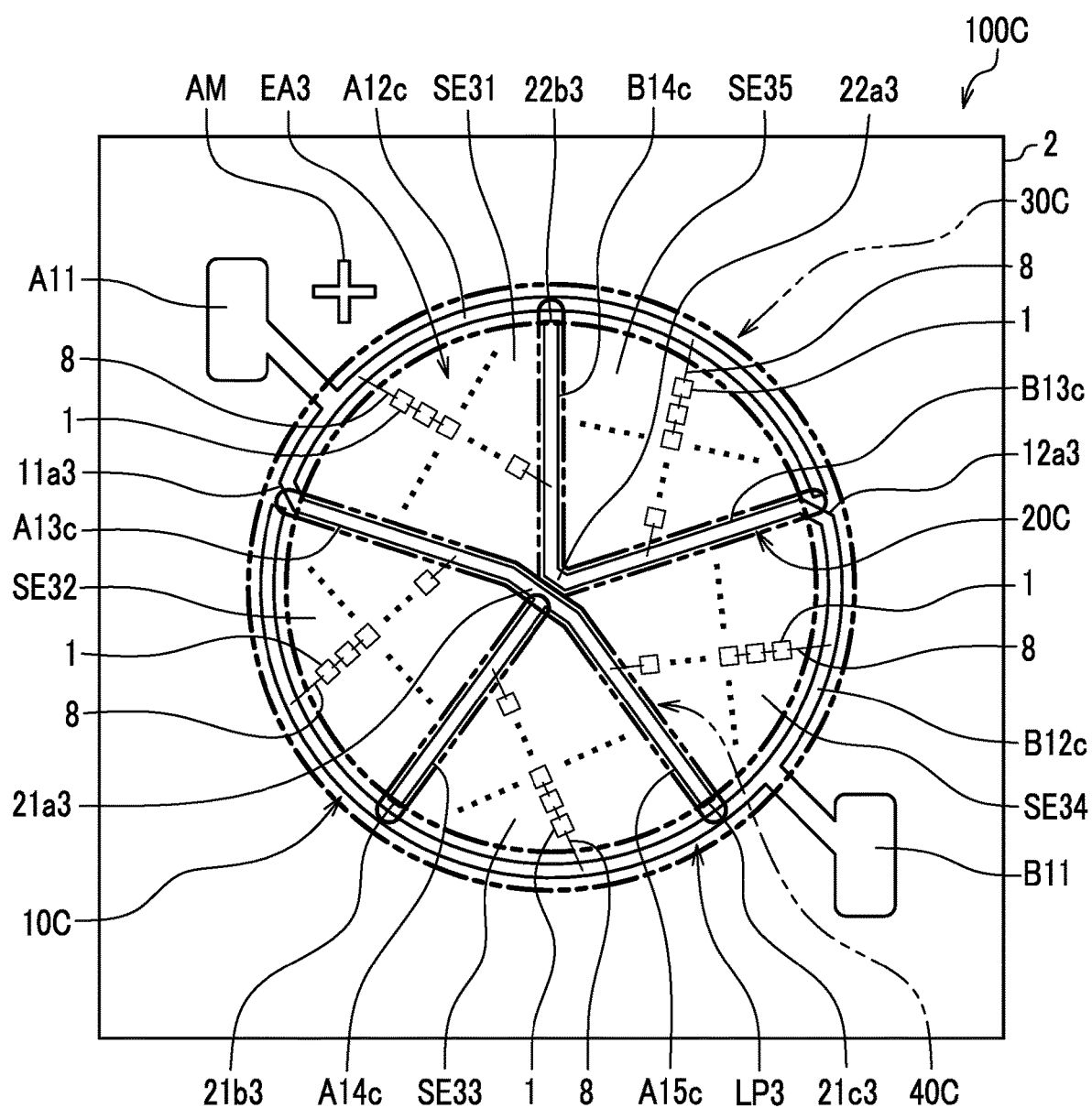
FIG. 7C is a schematic diagram showing a third variational example in which five demarcated regions are employed as a plurality of light-emitting regions of the light emitting device according to one embodiment of the present disclosure.

As shown in FIG. 7C, the light-emitting region EA3 may be demarcated into five regions of a first demarcated region SE31 to a fifth demarcated region SE35. The wiring pattern LP3 includes an anode pad A11, an arc-shaped anode-side frame part A12c, an anode-side first part A13c, an anode-side second part A14c, an anode-side third part A15c, a cathode pad B11, an arc-shaped cathode-side frame part B12b, a cathode-side first part B13c, and a cathode-side second part B14c.

In the wiring pattern LP3, the first wiring part 10C is formed with a single line and includes an arc-shaped anode-side frame part A12c and an arc-shaped cathode-side frame part B12c. The anode-side frame part A12c and the cathode-side frame part B12c are arranged such that a ratio of the lengths of the arcs is 2/5 to 3/5, and the example illustrated in FIG. 7C, the length of the arc of the anode-side is set to 2/5. In the wiring pattern LP3, the second wiring part 20C is formed with a single line and includes an anode-side first part A13c, an anode-side second part A14c, an anode-side third part A15c, a cathode-side first part B13c and a cathode-side second part B14c. The cathode-side first part B13c includes a connection end part 12a3 at its outer end side, through which, the cathode-side first part B13c is connected to the cathode-side frame part B12c. An equal number of the light emitting elements 1 are disposed in the first demarcated region SE31 to the fifth demarcated region SE35. The end 21b3 of the anode-side second part A14c is opposite separated from the cathode-side frame part B12c. The end 21c3 of the anode-side third part A15c is opposite separated from the cathode-side frame part B12c. The end 22b3 of the cathode-side second part B14c is opposite separated from the anode-side frame part A12c.

In the first demarcated region SE31, a plurality of strings of the light emitting elements 1 connected with wires 8 in series are connected to the cathode-side second part B14c and the anode-side frame part A12c with the wires 8 in parallel. In the second demarcated region SE32, a plurality of strings of the light emitting elements 1 connected with wires 8 in series are connected to the anode-side first part A13c and the cathode-side frame part B12c with the wires 8 in parallel. In the third demarcated region SE33, a plurality of strings of the light emitting elements 1 connected with wires 8 in series are connected to the cathode-frame part B12c and the anode-side wiring frame part A14c with the wires 8 in parallel. In the fourth demarcated region SE34, a plurality of strings of the light emitting elements 1 connected with wires 8 in series are connected to the cathode-frame part B12c and the anode-side wiring frame part A15c with the wires 8 in parallel. In the fifth demarcated region SE35, a plurality of strings of the light emitting elements 1 connected with wires 8 in series are connected to the anode-frame part A12c and the cathode-side wiring frame part B13c with the wires 8 in parallel.

The first wall part 30C is formed in a substantially circular ring shape along and covering the first wiring part 10C of the anode-side frame part A12c and the cathode-side frame part B12c, with a substantially uniform width that is larger than the width of the second wall part 40C. The second wall part 40C demarcates the region inward of the circular ring first wall part 30C into demarcated regions of 72 degrees, and covers the second wiring part 20C of the anode-side first part A13c, the anode-side second part A14c, the anode-side third part A15c, the cathode-side first part B13c, and the cathode-side second part B14c, with a width smaller than the width of the first wall part 30C.

The second wall part 40C is preferably formed prior to the first wall part 30C. The second wall part 40B is formed along and covering a connection end-part 11a3 of the anode-side first part A13c connected to the anode-side frame part A12c, a straight line-shaped portion of the anode-side first part A13c, a central connection part 21a3 between the anode-side first part A13c and a anode-side third part A15c, a straight line-shaped portion of the anode-side third part A15c from the central connection part 21a3 to an end portion 21c3 of the anode-side third part A15c. The second wall part 40C is also formed along and covering a V-shaped portion that is formed with the cathode-side first part B13c, a central connection part 22a3, and the cathode-side second part B14c, from a connection end-part 12a3 of the cathode-side first part B13c connected to the cathode-side frame part B12c to an end portion 22b3 of the cathode-side second part B14c. The second wall part 40C is formed along and covering the anode-side second part A14c of a straight line-shaped portion, from the end portion 21b3 to the central connection part 21a3. At the center connection part 21a3, the second wall part 40C covering the anode-side second part A14c is overlapped with the second wall part 40C covering the central connection part 21a3, such that portions of the second wall 40C are overlapped with each other at a portion of an approximately T-shape, where a vertical bar and an approximately horizontal bar meet.

After the second wall part 40C and the first wall part 30C are formed, a light-transmissive member 5 containing a wavelength converting material is disposed inward of the first wall part 30C. In the light emitting device 100C, the configuration of the anode-side wiring and the cathode-side wiring that form the second wiring part 20C may be reversed. That is, the second wiring part 20C may include the anode-side first part and the anode-side second part, and the cathode-side first part, the cathode-side second part, and the cathode-side third part.

Figure 7D:
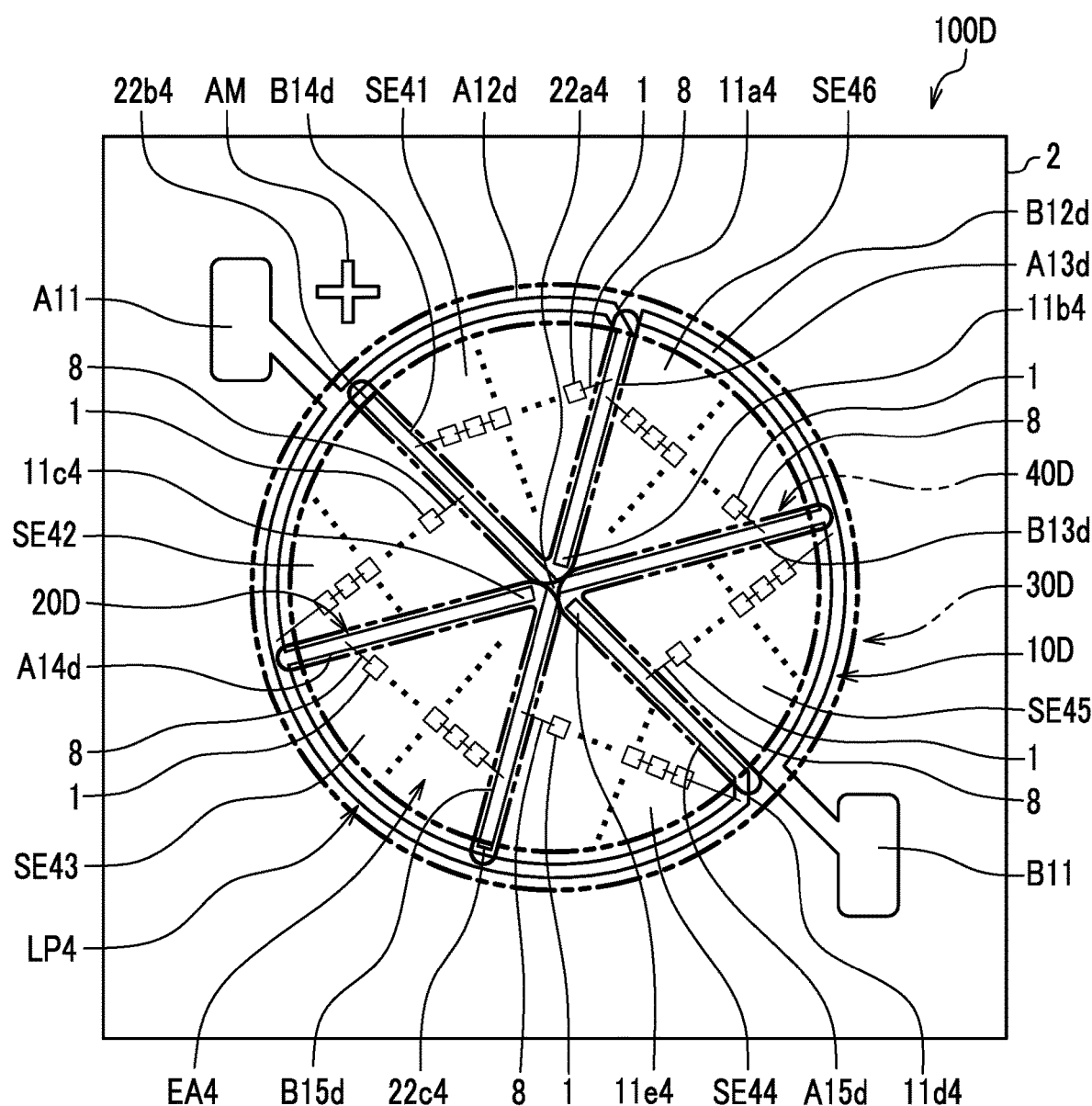
FIG. 7D is a schematic diagram showing a fourth variational example in which six demarcated regions are employed as a plurality of light-emitting regions of the light emitting device according to one embodiment of the present disclosure.

As shown in FIG. 7D, the light-emitting region EA4 may be demarcated into six regions of a first demarcated region SE41 to a sixth demarcated region SE46. The wiring pattern LP4 includes an anode pad A11, an arc-shaped anode-side frame part A12d, an anode-side first part A13d, an anode-side second part A14d, an anode-side third part A15d, a cathode pad B11, an arc-shaped cathode-side frame part B12d, a cathode-side first part B13d, a cathode-side second part B14d, and a cathode-side third part B15d.

In the wiring pattern LP4, the first wiring part 10D is formed with a single line and includes the arc-shaped anode-side frame part A12d and the arc-shaped cathode-side frame part B12d. The anode-side frame part A12d and the cathode-side frame part B12d are arranged such that a ratio of the lengths of the arcs is 2/6 to 4/6, and the example illustrated in FIG. 7D, the length of the arc of the anode-side is set to 4/6. In the wiring pattern LP4, the second wiring part 20D is formed with a single line and includes an anode-side first part A13d, an anode-side second part A14d, an anode-side third part A15d, a cathode-side first part B13d, a cathode-side second part B14d, and a cathode-side third part B15d. The cathode-side wiring of the second wiring part 20D is formed with a single line and includes a cathode-side first part B13d connected to the cathode-side frame B12d, a cathode-side second part B14d and a cathode-side third part B15d respectively branched in two directions from the cathode-side first part at a connection portion 22a4 corresponding to an end of the cathode-side first part B13d. A same number of the light emitting elements 1 are disposed in each of the first demarcated region SE41 to the sixth demarcated region SE46.

In the first demarcated region SE41, a plurality of strings of the light emitting elements 1 connected with wires 8 in series are connected to the cathode-side second part B14d and the anode-side the first wiring part A13d with the wires 8 in parallel. In the second demarcated region SE42, a plurality of strings of the light emitting elements 1 connected with wires 8 in series are connected to the anode-side frame part A12d and the cathode-side second part B14d with the wires 8 in parallel. In the third demarcated region SE43, a plurality of strings of the light emitting elements 1 connected with wires 8 in series are connected to the anode-side second part A14d and the cathode-side third part B15d with the wires 8 in parallel. In the fourth demarcated region SE44, a plurality of strings of the light emitting elements 1 connected with wires 8 in series are connected to the anode-side frame part A12d and the cathode-side third part B15d with the wires 8 in parallel. In the fifth demarcated region SE45, a plurality of strings of the light emitting elements 1 connected with wires 8 in series are connected to the anode-side third part A15d and the cathode-side frame part B12d with the wires 8 in parallel. In the sixth demarcated region SE46, a plurality of strings of the light emitting elements 1 connected with wires 8 in series are connected to the anode-side first part A13d and the cathode-side first part B13d with the wires 8 in parallel.

The first wall part 30D is formed in a substantially circular ring shape along and covering the first wiring part 10D of the anode-side frame part A12d and the cathode-side frame part B12d, with a substantially uniform width that is larger than the width of the second wall part 40D. The second wall part 40D demarcates the region inward of the circular ring first wall part 30D into demarcated regions of 60 degrees, and covers the second wiring part 20D of the anode-side first part A13d, the anode-side second part A14d, the anode-side third part A15d, the cathode-side first part B13d, the cathode-side second part B14d, and the cathode-side third part B15d, with a width smaller than the width of the first wall part 30D.

The second wall part 40D is preferably formed prior to the first wall part 30D. The second wall 40D is formed with three V-shaped portions. A first V-shaped portion of the second wall 40D is formed to cover a straight line-shaped portion of the anode-side first part A13d from a connection end 11a4 connected to the anode-side frame part A12d to a central connection portion 11b4, and a straight line-shaped portion of the cathode-side second part B14d from a central connection portion 22a4 to an end portion 22b4. A second V-shaped portion of the second wall part 40D is formed along and covering a straight line-shaped portion of the anode-side second part A14d, a straight line-shaped portion of the cathode-side third part B15d, and a central connection portion 22a4 of the cathode-side third part B15d. A third V-shaped portion of the second wall part 40D is formed along and covering a straight line-shaped portion of the anode-side third part A15d, a straight line-shaped portion of the cathode-side first part B13d, and a central connection portion 22a4 of the cathode-side third part B15d. As illustrated above, the second wall part 40D can be formed with line-shaped walls of three V-shaped portions, which are separately adjacent to each other at the bents of the V-shapes at a center portion of the light-emitting region EA4, such that overlapping of the wall portions at the center can be avoided and the height of the wall second wall 40D at the center with respect to the surface of the substrate 2 can be formed substantially uniform to other portions of the wall parts. After the second wall part 40D and the first wall part 30D are formed, a light-transmissive member 5 containing a wavelength converting material is disposed inward of the first wall part 30D.

Figure 7E:
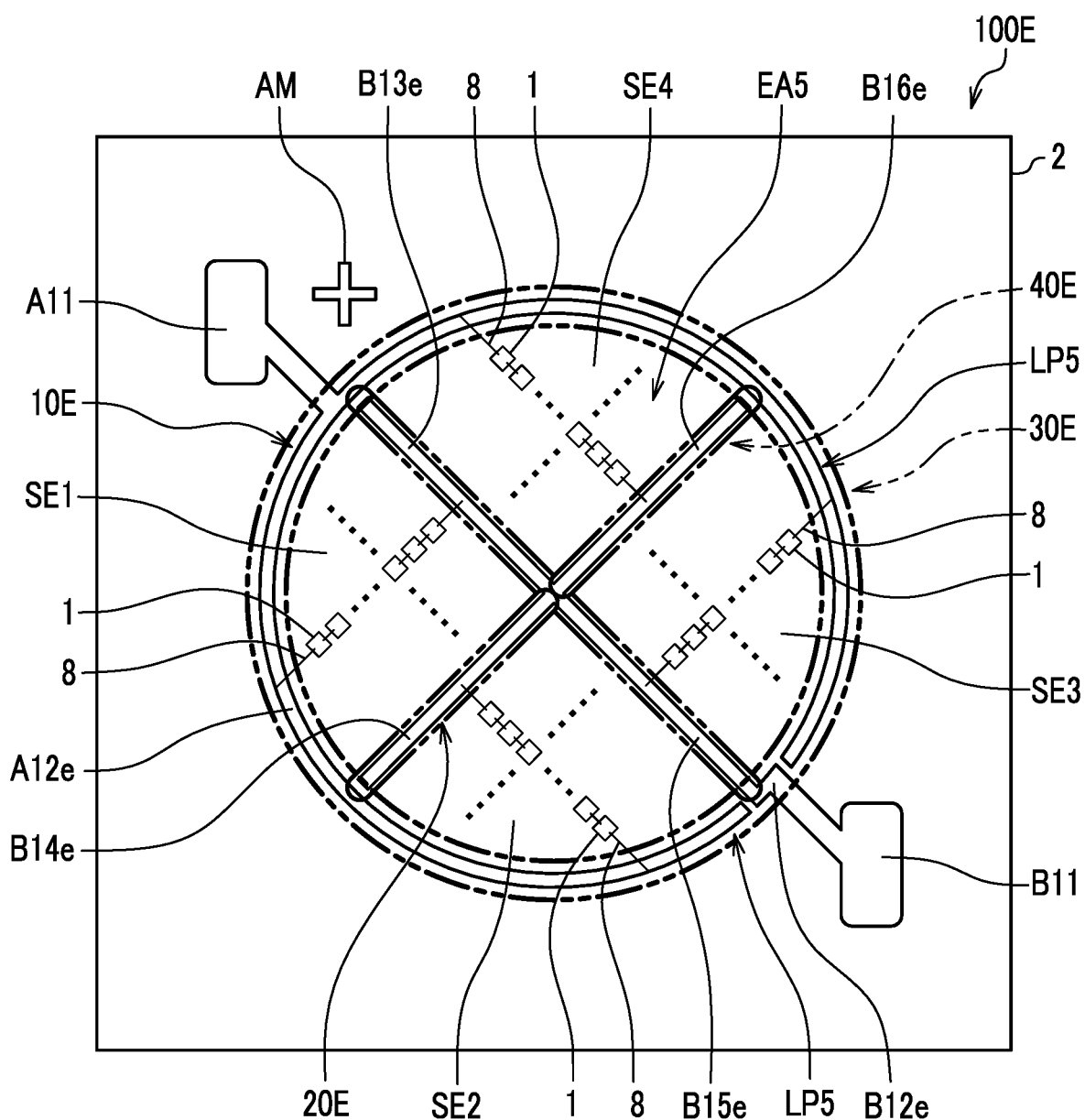
FIG. 7E is a schematic diagram showing a fifth variational example in which four demarcated regions in a different configuration are employed as a plurality of light-emitting regions of the light emitting device according to one embodiment of the present disclosure.

In the above, as shown in FIG. 2 to FIG. 7D, except for FIG. 7A, the first wiring part and the second wiring part each includes at least a portion of the anode-side wiring and at least a portion of the cathode-side wiring, but as shown in FIG. 7E, the first wiring part may be formed with the anode-side wiring and the second wiring part may be formed with the cathode-side wiring, or the first wiring part may be formed with the cathode-side wiring and the second wiring part may be formed with the anode-side wiring.

That is, as shown in FIG. 7E, the light emitting device 100E has a wiring patter PL5 including the anode-side wiring as the first wiring portion 10E and the cathode-side wiring as the second wiring portion 20E. In the light emitting device 100E, the light-emitting region EA5 is demarcated into four demarcated regions of the first demarcated region SE1 to the fourth demarcated region SE4.

The first wiring part 10E is formed with a single line of an anode-side frame part A12e extended from the anode pad A11 and branched in a circular ring shape. The second wiring part 20E is formed with a single line extended from the cathode pad B11 and branched in four directions at 90 degrees, at the center portion of the light emitting region EA5, and includes a cathode-side first B13e, a cathode-side second part B14e, a cathode-side third part B15e, and a cathode-side fourth part B16e. In FIG. 7E, the second wiring part 20E is connected to the cathode pad B11 through a portion of the circular ring cathode-side frame portion B12e having a small arc length, but such a portion of the circular ring cathode-side frame portion B12e is not necessary.

In the first demarcated region SE1, a plurality of strings of the light emitting elements 1 connected with wires 8 in series are connected to the cathode-side first part B13e and the anode-side frame part A13e with the wires 8 in parallel. In the second demarcated region SE2, a plurality of strings of the light emitting elements 1 connected with wires 8 in series are connected to the cathode-side second part B14e and the anode-side frame part A13e with the wires 8 in parallel. In the third demarcated region SE3, a plurality of strings of the light emitting elements 1 connected with wires 8 in series are connected to the cathode-side third part B15e and the anode-side frame part A13e with the wires 8 in parallel. In the fourth demarcated region SE4, a plurality of strings of the light emitting elements 1 connected with wires 8 in series are connected to the cathode-side fourth part B16e and the anode-side frame part A13e with the wires 8 in parallel. In the configuration illustrated in FIG. 7E, the number of the demarcated regions can be determined by the number of branches of the cathode-side wiring.

The first wall part 30E is formed in a substantially circular ring shape along and covering the first wall part 10E of the anode-side frame part A12e, with a substantially uniform width that is larger than the width of the second wall part 40E. The second wall part 40E demarcates the region inward of the circular ring first wall part 30E into demarcated regions of 90 degrees, and covers the second wiring part 20E of the cathode-side first part B13e, the cathode-side second part B14e, the cathode-side third part B15e, the cathode-side fourth part B16e, with a substantially uniform width that is smaller than the width of the first wall part 30E.

The second wall part 40E is formed with four line-shaped wall parts each covering an end portion to a center portion of a respective one of the straight line-shaped portions; the cathode-side first part B13e, the cathode-side second part B14e, the cathode-side third part B15e, and the cathode-side fourth part B16e. The second wall part 40E can be formed with two V-shaped parts each covering adjacent two of the cathode-side first part B13e, the cathode-side second part B14e, the cathode-side third part B15e, and the cathode-side fourth part B16e. The second wall part 40E is preferably formed prior to the first wall part 30E. The second wall part 40E can be formed with line-shaped wall that are separately adjacent to each other at the center portion of the light-emitting region EA5, such that overlapping of the wall portions at the center portion can be avoided and the height of the second wall 40E at the center with respect to the surface of the substrate 2 can be formed substantially uniform to other portions of the wall parts. After the second wall part 40D and the first wall part 30E are formed, a light-transmissive member 5 containing a wavelength converting material is disposed inward of the first wall part 30E.

The light emitting devices described above can be manufactured through similar steps, with a change in the shapes of the wiring pattern and in the forming of the second wall. Further, in each of the light emitting devices described above, disposing the wiring pattern in a point symmetry with respect to a center of the light-emitting region can be obtained by shifting a nozzle supplying a resin material for the first wall part and the second wall part or shifting the substrate-side in bilaterally symmetrical directions, which can facilitate the manufacturing.

Each of the light emitting devices may include a protective element such as Zener diode mounted on the substrate 2. The number of the light emitting elements 1 can be appropriately selected. The number of the light emitting elements 1 connected in series can be twelve of less. The number of plurality of strings of the light emitting elements connected in series can be appropriately selected.

In the light emitting devices, the demarcated regions can be demarcated by a portion of anode-side frame and two cathode wiring parts, by a portion of anode-side frame, cathode-side wiring part and anode-side wiring part, by a portion of the cathode-side frame part and two anode-wiring parts, or by a portion of the cathode-side frame part, the anode-side wiring part and the cathode-side wiring part. Accordingly, particularly, forming the second wiring part other than the anode-side frame part and the cathode-side frame part in a single line, allows for electrical connection of an increasing number of the light emitting elements with the use of wires or the like, and further, can realize a light emitting device that can emit light with uniform distribution from the entire light-emitting region.

Other than the configurations illustrated in the figures, the second wiring part can be formed in a single line with a straight line-shaped portion extending from the periphery of the light-emitting region toward the center thereof, and/or a straight line-shaped portion that is curved or bent at the center portion of the light-emitting region and extending toward the periphery thereof. Further, other than the configurations illustrated in the figures, the second wiring part can be formed in a single line with a straight line-shaped portion extending from the periphery of the light-emitting region toward the center thereof, branched at the center portion, and further extending in straight line shapes toward the periphery of the light-emitting region.

The light emitting device and the method of manufacturing the light emitting device according to the respective embodiments of the present invention can be suitably used in applications such as general lighting, backlight light sources of liquid crystal displays, light sources for automobile use such as vehicular headlights. Or the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
a substrate;
a plurality of light emitting elements disposed on the substrate;
at least one first wiring part surrounding a light-emitting region on the substrate where the plurality of light emitting elements are disposed;
at least one second wiring part, together with the at least one first wiring part, demarcating the light-emitting region into a plurality of demarcated regions;
a first wall formed along and covering the at least one first wiring part to surround the light-emitting region;
at least one second wall formed along and covering corresponding one or more of the at least one second wiring part; and
a light-transmissive member containing a wavelength converting material, covering an entire light-emitting region including the plurality of light emitting elements disposed in each of the plurality of demarcated regions;
wherein an end portion of the first wiring part and an end portion of the second wiring part are continuously connected through a first diagonal portion in a plan view,
wherein the first diagonal portion faces the end portion of the first wiring part having a polarity different from a polarity of the first diagonal portion, and
the first diagonal portion is inclined with respect to the end portion of the first wiring part in a plan view.

2. The light emitting device according to claim 1, wherein an angle formed by an edge of the end portion of the first wiring part and an edge of the first diagonal portion is an acute angle in a plan view.

3. The light emitting device according to claim 1, wherein the at least one second wiring part is extended from a corresponding one of the at least one first wiring part toward a center of the light-emitting region to demarcate the plurality of demarcated regions.

4. A light emitting device comprising:
a substrate;
a plurality of light emitting elements disposed on the substrate;
at least one first wiring part surrounding a light-emitting region on the substrate where the plurality of light emitting elements are disposed;
at least one second wiring part, together with the at least one first wiring part, demarcating the light-emitting region into a plurality of demarcated regions;
a first wall formed along and covering the at least one first wiring part to surround the light-emitting region;
at least one second wall formed along and covering corresponding one or more of the at least one second wiring part; and
a light-transmissive member containing a wavelength converting material, covering an entire light-emitting region including the plurality of light emitting elements disposed in each of the plurality of demarcated regions;
wherein an end portion of the first wiring part and an end portion of the second wiring part are continuously connected through a first diagonal portion in a plan view,
wherein the at least one first wiring part and the at least one second wiring part demarcating each of the plurality of demarcated regions are formed such that at least a portion of the at least one first wiring part is an anode-side wiring and at least a portion of the at least one second wiring part is a cathode-side wiring, or at least a portion of the at least one first wiring part is a cathode-side wiring and at least a portion of the at least one second wiring part is an anode-side wiring, and
wherein the at least one second wiring part is extended from a corresponding one of the at least one first wiring part toward a center of the light-emitting region and bent before reaching the center toward an outer edge of the light-emitting region to demarcate the plurality of demarcated regions.

5. The light emitting device according to claim 4, wherein the light-emitting region includes the two second wiring parts having different polarities from each other, and
one of the second wiring parts has a second diagonal portion which is inclined with respect to an end portion of the other second wiring part in a plan view.

6. The light emitting device according to claim 5, wherein, in a plan view, the first diagonal portion and the second diagonal portion are parallel.

7. The light emitting device according to claim 1, wherein, in a plan view, at least a part of the first diagonal portion overlaps the first wall and the end portion of the second wall, respectively.

8. The light emitting device according to claim 7, wherein the second wall is formed with a height smaller than the height of the first wall.

9. The light emitting device according to claim 4, wherein the at least one second wiring part is extended from a corresponding one of the at least one first wiring part toward a center of the light-emitting region to demarcate the plurality of demarcated regions.

10. The light emitting device according to claim 4, wherein, in a plan view, at least a part of the first diagonal portion overlaps the first wall and the end portion of the second wall, respectively.

* * * * *